US010121784B2

(12) United States Patent
Nita et al.

(10) Patent No.: US 10,121,784 B2
(45) Date of Patent: *Nov. 6, 2018

(54) SEMICONDUCTOR APPARATUS

(71) Applicant: Renesas Electronics Corporation, Tokyo (JP)

(72) Inventors: Junichi Nita, Tokyo (JP); Kazutaka Suzuki, Tokyo (JP); Takahiro Korenari, Tokyo (JP); Yoshimasa Uchinuma, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 58 days.

This patent is subject to a terminal disclaimer.

(21) Appl. No.: 15/044,875

(22) Filed: Feb. 16, 2016

(65) Prior Publication Data
US 2016/0163698 A1   Jun. 9, 2016

Related U.S. Application Data

(63) Continuation of application No. 14/508,771, filed on Oct. 7, 2014, now Pat. No. 9,293,456.

(30) Foreign Application Priority Data

Nov. 12, 2013 (JP) ................................. 2013-234091

(51) Int. Cl.
*H01L 27/088* (2006.01)
*H01L 21/768* (2006.01)
(Continued)

(52) U.S. Cl.
CPC ...... *H01L 27/088* (2013.01); *H01L 21/76895* (2013.01); *H01L 21/823475* (2013.01);
(Continued)

(58) Field of Classification Search
CPC ..................................................... H01L 27/088
See application file for complete search history.

(56) References Cited

U.S. PATENT DOCUMENTS 6,653,740 B2 * 11/2003 Kinzer ................ H01L 23/3114
257/220
6,900,482 B2    5/2005 Aoki et al.
(Continued)

FOREIGN PATENT DOCUMENTS

JP    WO 01/59842 A1    8/2001
JP    2004-502293 A    1/2004
(Continued)

OTHER PUBLICATIONS

Japanese Office Action dated Aug. 8, 2017, with a partial English translation.

*Primary Examiner* — Eugene Lee
(74) *Attorney, Agent, or Firm* — McGinn IP Law Group, PLLC

(57) ABSTRACT

A semiconductor apparatus includes a first area, a first transistor being formed in two or more divided areas of the first area, and a second area, a second transistor being formed in two or more divided areas of the second area. The number of areas of the second area is greater than the number of areas of the first area, the divided areas of the first area and the second area are alternately arranged, and the gate pad of the first transistor and the gate pad of the second transistor are formed in the second area.

17 Claims, 31 Drawing Sheets

(51) Int. Cl.
    *H01L 21/8234*     (2006.01)
    *H01L 27/02*     (2006.01)
    *H01L 23/528*     (2006.01)
    *H01L 23/535*     (2006.01)
    *H01L 29/423*     (2006.01)
    *H01L 29/78*     (2006.01)
    *H01L 29/08*     (2006.01)

(52) U.S. Cl.
    CPC .. *H01L 21/823487* (2013.01); *H01L 23/5283* (2013.01); *H01L 23/535* (2013.01); *H01L 27/0207* (2013.01); *H01L 29/4236* (2013.01); *H01L 29/7827* (2013.01); *H01L 29/0865* (2013.01); *H01L 2924/0002* (2013.01)

(56) References Cited

U.S. PATENT DOCUMENTS

| | | |
|---|---|---|
| 9,070,550 B2 | 6/2015 | Kobayashi et al. |
| 2005/0224887 A1 | 10/2005 | Matsuki et al. |
| 2006/0118811 A1 | 2/2006 | Zheng et al. |
| 2013/0320454 A1 | 12/2013 | Suzuki et al. |

FOREIGN PATENT DOCUMENTS

| | | |
|---|---|---|
| JP | 3917144 A | 5/2007 |
| JP | 2007-201338 A | 8/2007 |
| JP | 2010-087127 A | 4/2010 |
| JP | 2013-247309 A | 12/2013 |

\* cited by examiner

SEMICONDUCTOR APPARATUS

CROSS-REFERENCE TO RELATED APPLICATIONS

This application is based upon and claims the benefit of priority from U.S. patent application Ser. No. 14/508,771, filed on Oct. 7, 2014, the disclosure of which is incorporated herein in its entirety by reference.

This application is based upon and claims the benefit of priority from Japanese patent application No. 2013-234091, filed on Nov. 12, 2013, the disclosure of which is incorporated herein in its entirety by reference.

BACKGROUND

The present invention relates to a semiconductor apparatus, and for example, a semiconductor apparatus including a trench power transistor.

Development of a CSP (Chip Size Package) MOSFET (Metal-Oxide-Semiconductor Field-Effect Transistor) for lithium ion (Li+) battery protection (EFLIP: Ecologically Flip chip MOSFET for Lithium-Ion battery Protection) has been proceeding. As such a MOSFET, a one-chip dual MOSFET structure in which a drain electrode formed of a metal plate or a metal film is placed on a back surface is well known (Published Japanese Translation of PCT International Publication for Patent Application, No. 2004-502293, Japanese Patent No. 3917144, and Japanese Patent Application No. 2012-121503).

In a semiconductor apparatus disclosed in Published Japanese Translation of PCT International Publication for Patent Application, No. 2004-502293, a chip is partitioned into four areas, and FETs 1 and FETs 2 are alternately arranged. The FET 1 and FET 2 are in U-shapes, and the FET 1 and FET 2 are engaged with each other. Gate pads G1 and G2 of the FET 1 and FET 2 are formed within the areas of their respective FETs 1 and 2, at opposed corners of the chip.

Japanese Patent No. 3917144 discloses a one-chip dual MOSFET structure in which more number of MOS1 areas and MOS2 areas than they are in the Published Japanese Translation of PCT International Publication for Patent Application, No. 2004-502293 are alternately arranged, and gate pads G1 and G2 are disposed on one side of the chip.

Japanese Patent Application No. 2012-121503 discloses a semiconductor apparatus including a semiconductor chip that is partitioned into three areas, which are a first area, a second area, and a third area, and a common drain electrode that is disposed on a back surface of the semiconductor chip. Further, in the semiconductor apparatus disclosed in Japanese Patent Application No. 2012-121503, the second area is formed between the first area and the third area, first MOSFETs are formed in the first area and the third area, and a second MOSFET is formed in the second area.

SUMMARY

One-chip dual MOSFET includes two MOSFETs, and a resistance between those source electrodes RSSON is used as an indicator of its performance. However, the present inventor has found out a problem in the techniques disclosed in Published Japanese Translation of PCT International Publication for Patent Application, No. 2004-502293, Japanese Patent No. 3917144, and Japanese Patent Application No. 2012-121503 that the inter-source electrode resistance RSSON cannot be sufficiently reduced.

Other issues and new features will be apparent from the description of the specification and attached drawings.

An aspect of the present invention is a semiconductor apparatus that divides each of a first area in which a first transistor is formed and a second area in which a second transistor is formed into two or more areas, and alternately arranges the divided areas of the first area and the second area. Further, the semiconductor apparatus according to one embodiment configures the second area to have a total area larger than that of the first area or to have the number of divisions greater than that of the first area. Furthermore, in the semiconductor apparatus according to one embodiment, a gate pad of the first transistor and a gate pad of the second transistor are provided in the second area.

According to the above aspect, it is possible to reduce an inter-source electrode resistance of the semiconductor apparatus.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
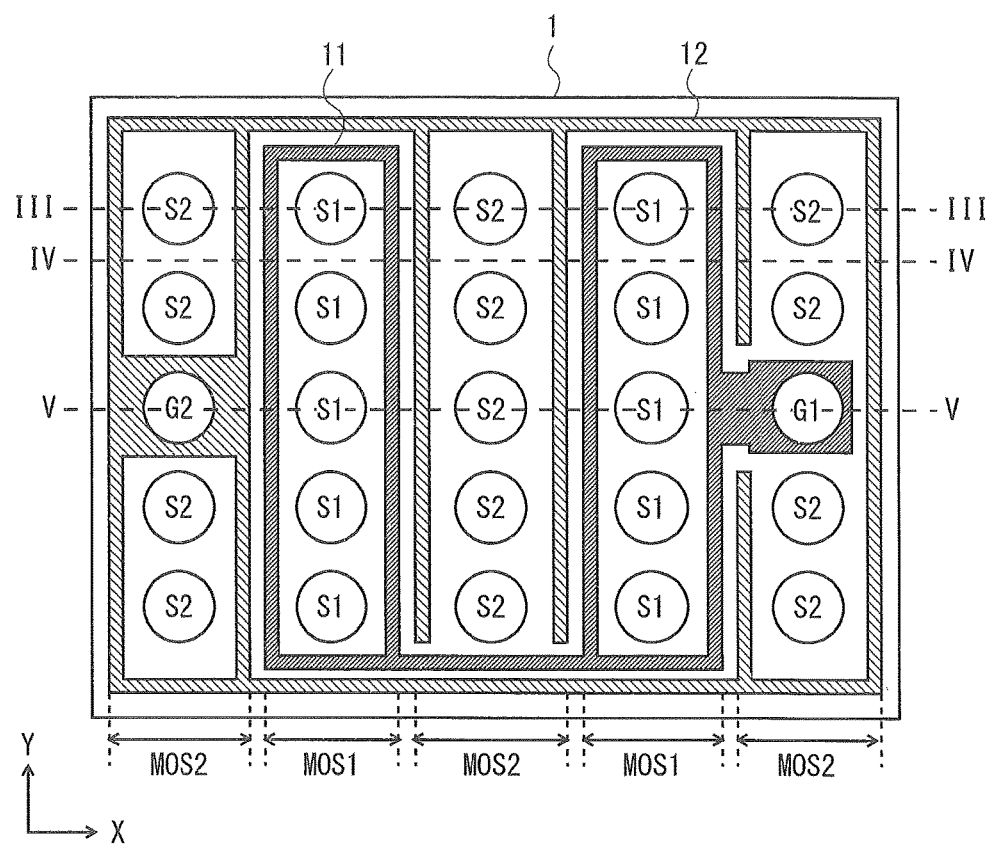
FIG. 1 is a schematic diagram of a layout of a semiconductor apparatus according to a first embodiment.

For clarity of the explanation, the following descriptions and drawings are omitted and simplified as appropriate. Further, the same components are denoted by the same reference numerals throughout the drawings, and a repeated explanation shall be omitted as necessary.

A semiconductor apparatus according to an embodiment relates to a one-chip dual MOSFET having a common drain electrode on the back surface. Further, the semiconductor apparatus according to the embodiment can improve mountability by an arrangement of gate pads of two MOSFETs. Furthermore, in the semiconductor apparatus according to the embodiment, a first transistor MOS1 is formed in a first area, a second transistor MOS2 is formed in a second area, the first and second areas are divided into a plurality of areas, and the divided areas are alternately arranged in the first and second areas. In this manner, the semiconductor apparatus according to this embodiment can reduce an inter-source electrode resistance RSSON.

Hereinafter, a direction in which the first and second areas are alternately arranged shall be referred to as a first direction (hereinafter referred to as an X-direction), a long-side direction of one area shall be referred to as a second direction (hereinafter referred to as a Y-direction), and a thickness direction of the semiconductor chip shall be referred to as a third direction (hereinafter referred to as a Z-direction).

Further, the semiconductor apparatus includes a semiconductor chip including a semiconductor substrate and a wiring layer that is formed in a layer above the semiconductor substrate. Hereinafter, in a semiconductor substrate, a plane where an active area of a transistor is formed shall be referred to as a front surface of the semiconductor substrate, while a plane opposite to the surface shall be referred to as a back surface of the semiconductor substrate. Additionally, a surface of the semiconductor chip where the wiring layer is formed shall be referred to as a front surface of the semiconductor chip, while a back surface of the semiconductor substrate shall be referred to as a back surface of the semiconductor chip.

First Embodiment

FIG. 1 is a schematic diagram of a layout of a semiconductor apparatus 1 according to a first embodiment. As shown in FIG. 1, in the semiconductor apparatus 1 according to the first embodiment, a first transistor MOS1 and a second transistor MOS2 are formed on a semiconductor substrate. Further, in the semiconductor apparatus 1, source pads S1 and a gate pad G1 of a first transistor and source pads S2 and a gate pad G2 of a second transistor are formed on the front surface of the semiconductor chip. These source pads and gate pads are connection terminals to a circuit board on which the semiconductor apparatus 1 is mounted. That is, in the semiconductor apparatus 1 according to the first embodiment, the front surface of the semiconductor chip is flip-flop mounted on the circuit board.

Further, as shown in FIG. 1, in the semiconductor apparatus 1 according to the first embodiment, the semiconductor substrate includes a first area in which a first transistor MOS1 is formed and a second area in which a second transistor is formed. Furthermore, each of the first area and the second area is divided into two or more areas. In the first embodiment, the second area is configured to have a total area larger than the first area. In a different perspective, the second area is configured in such a manner that the number of divisions of the second area will be greater than that of the first area. In the example shown in FIG. 1, the width (the length in the X-direction) and the height (the length in the Y-direction) of the respective divided areas (the length in the X-direction) are configured to be substantially the same, and the number of divisions of the second area is configured to be greater than the number of divisions of the first area, so that a total area of the second area is greater than that of the first area. Moreover, in the semiconductor apparatus 1 according to the first embodiment, the divided first area and the divided second area are alternately arranged in the X-direction.

Note that the area of the first area and the area of the second area are defined by an area of the active area of a corresponding transistor (an area where a source diffusion layer is formed). In the example shown in FIG. 1, the active areas of the transistor area formed in areas inside gate lines 11 and 12. Further, in the semiconductor apparatus 1 according to the first embodiment, the number of divisions of the first area is two, and the number of divisions of the second area is three. The total number of the divisions of the first area and the second area is preferably five or greater.

In the semiconductor apparatus 1 according to the first embodiment, the gate pad G1 of the first transistor MOS1 and the gate pad G2 of the second transistor MOS2 are formed in the second area, which has a total area larger (or the number of divisions is greater) than that of the first area. The gate pad G1 and the gate pad G2 are disposed along a contour of the semiconductor chip. In the first embodiment, a source pad sequence, in which the source pads S2 are arranged in the Y-direction, is formed in each of the divided areas of the second area, and the gate pads G1 and G2 are arranged in a plurality of different source pad sequences. In the example shown in FIG. 1, the gate pad G1 and the gate pad 2 are disposed in an outermost area of the second area. In the example shown in FIG. 1, the gate pad G1 and the gate pad G2 are disposed at a substantially center of the source pad sequence in the Y-direction.

Moreover, as shown in FIG. 1, in the semiconductor apparatus 1 according to the first embodiment, the gate line 11 of the first transistor MOS1 is continuously formed across the divided first area. The gate line 11 is connected to the gate pad G1. Further, in the semiconductor apparatus 1 according to the first embodiment, the gate line 12 of the second transistor MOS2 is continuously formed across the divided first area. The gate line 12 is connected to the gate pad G2. The gate lines 11 and 12 distribute a voltage provided to the gate pads to trench gate electrodes (not shown in the drawings) that are formed in the active areas of the transistor.

Furthermore, in the semiconductor apparatus 1 according to the first embodiment, the first source pads (e.g., the source pads S1) that are connected to the source of the first transistor MOS1 are formed in the first area, and the second source pads (e.g., the source pads S2) that are connected to the source of the second transistor MOS2 are formed in the second area. The source pads 2 are formed in such a manner that a total area of the source pads S2 will be greater than a total area of the source pads S2, or the number of the source pads S2 will be greater than the number of the source pads S1.

That is, in the semiconductor apparatus 1 according to the first embodiment, each area is determined by setting the first area, which is divided into two or more areas, and by setting the second area, which has the total area larger than that of the first area and is divided into two or more areas, and the divided areas of the first area and the second area are alternately arranged. Further, in the semiconductor apparatus 1 is manufactured by forming the first transistor MOS1 in the first area, forming the second transistor MOS2 in the second area, and forming the gate pad G1 of the first transistor MOS1 and the gate pad G2 of the second transistor MOS2 in the second area. Note that the second area can be configured as an area where the number of divisions is greater than that of the first area.

Moreover, the semiconductor apparatus 1 according to the first embodiment is manufactured in such a manner that the gate line 11 of the first transistor MOS1 is connected to the gate pad G1 of the first transistor MOS1, and the gate line 11 is continuously formed across the divided first area. The semiconductor apparatus 1 is manufactured in such a manner that the gate line 12 of the second transistor MOS2 is connected to the gate pad G2 of the second transistor MOS2, and the gate line 12 is continuously formed across the divided second area.

Figure 2:
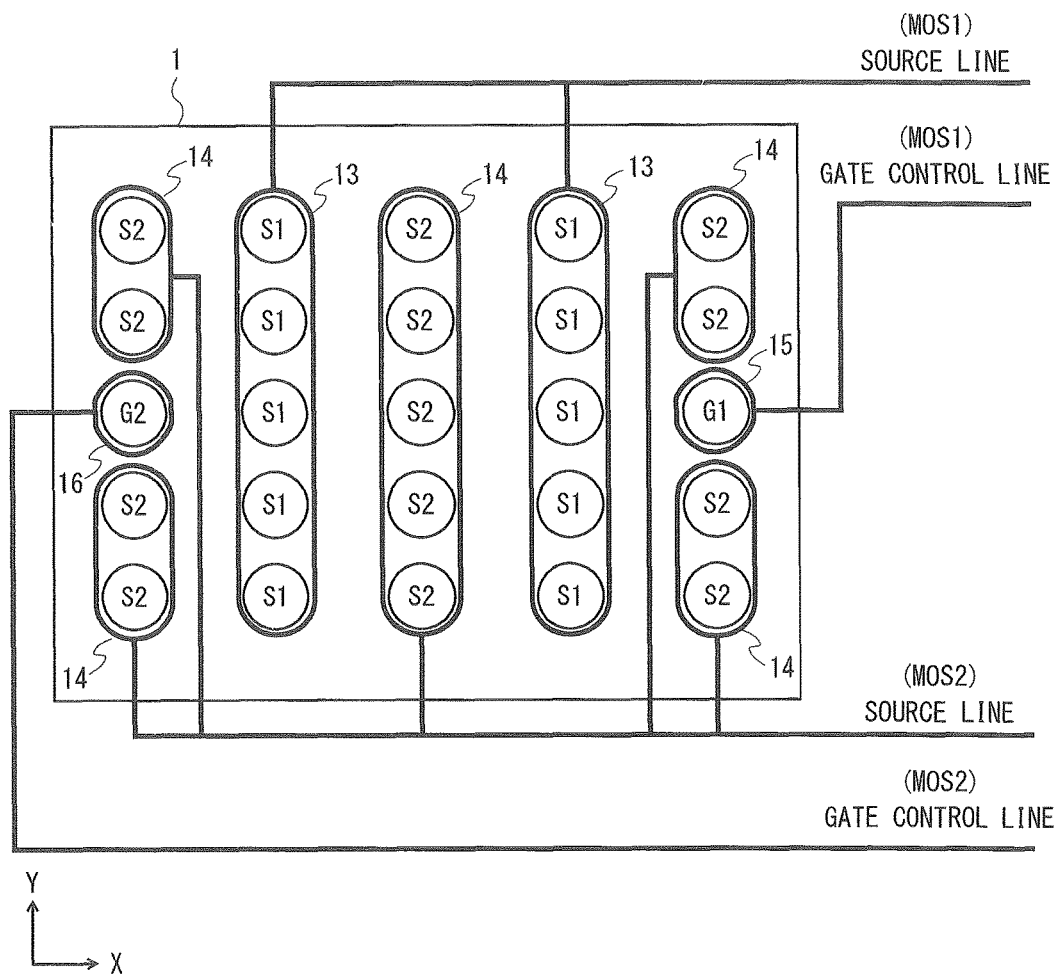
FIG. 2 is a schematic diagram for explaining a mounted state of the semiconductor apparatus according to the first embodiment.

Next, the implementation of the semiconductor apparatus 1 according to the first embodiment shall be explained. FIG. 2 is a schematic diagram for explaining a mounted state of the semiconductor apparatus according to the first embodiment. FIG. 2 illustrates, in addition to the source pads S1 and S2 and the gate pads G1 and G2 of the semiconductor apparatus 1, substrate source patterns 13 and 14, and substrate gate patterns 15 and 16 that are provided on the circuit board and source lines and gate control lines on the circuit board that are connected to these patterns.

As shown in FIG. 2, in the semiconductor apparatus 1 according to the first embodiment, the source pads S1 and S2 are disposed in a sequence so that they extend in the Y-direction of the semiconductor chip. Moreover, in the semiconductor apparatus 1 according to the first embodiment, the gate pads G1 and G2 are arranged at both ends of the semiconductor chip in the X-direction. Therefore, the source line that is connected to the source pads is wired not to cross each other. Further, the gate control lines that are connected to the gate pads are wired not to cross the source lines and other gate control lines.

Specifically, by using the semiconductor apparatus 1 according to the first embodiment, the wiring on the circuit board can be formed in single-layer wiring. In this manner, a system incorporating the semiconductor apparatus 1 can reduce the resistance of the wiring on the circuit board, thereby reducing the inter-source electrode resistance RSSON in the mounted state.

Figure 3:
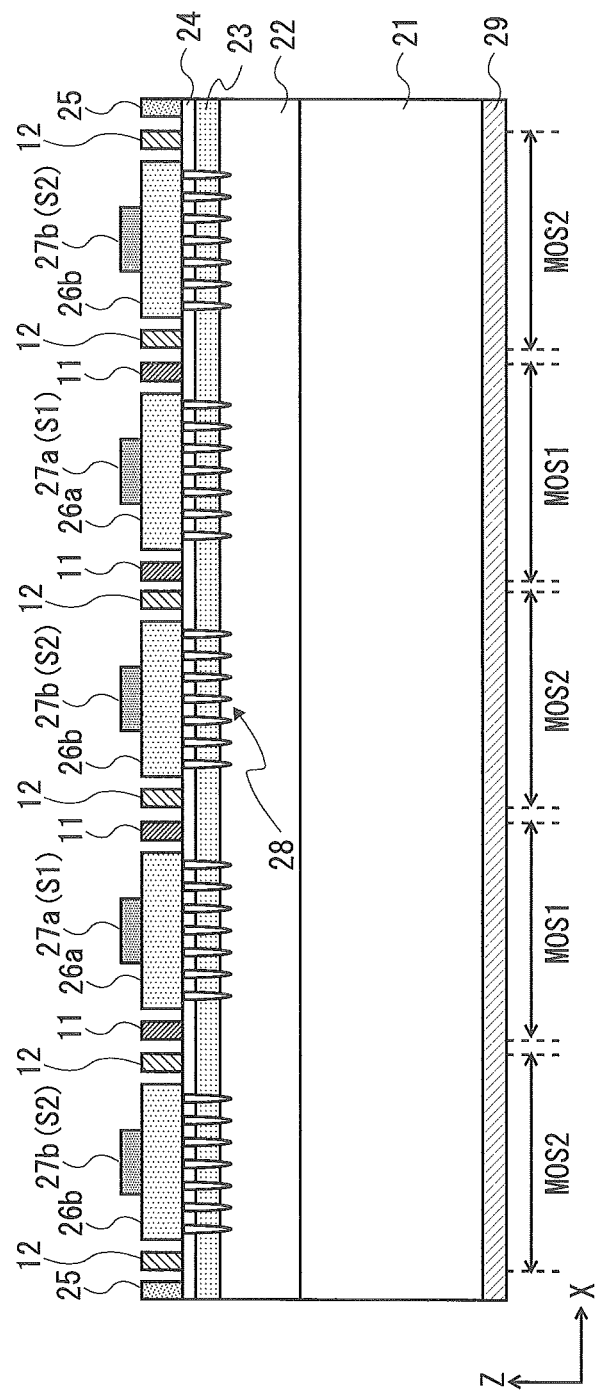
FIG. 3 is a cross-sectional diagram of the semiconductor apparatus taken along the line III-III of FIG. 1.
Figure 4:
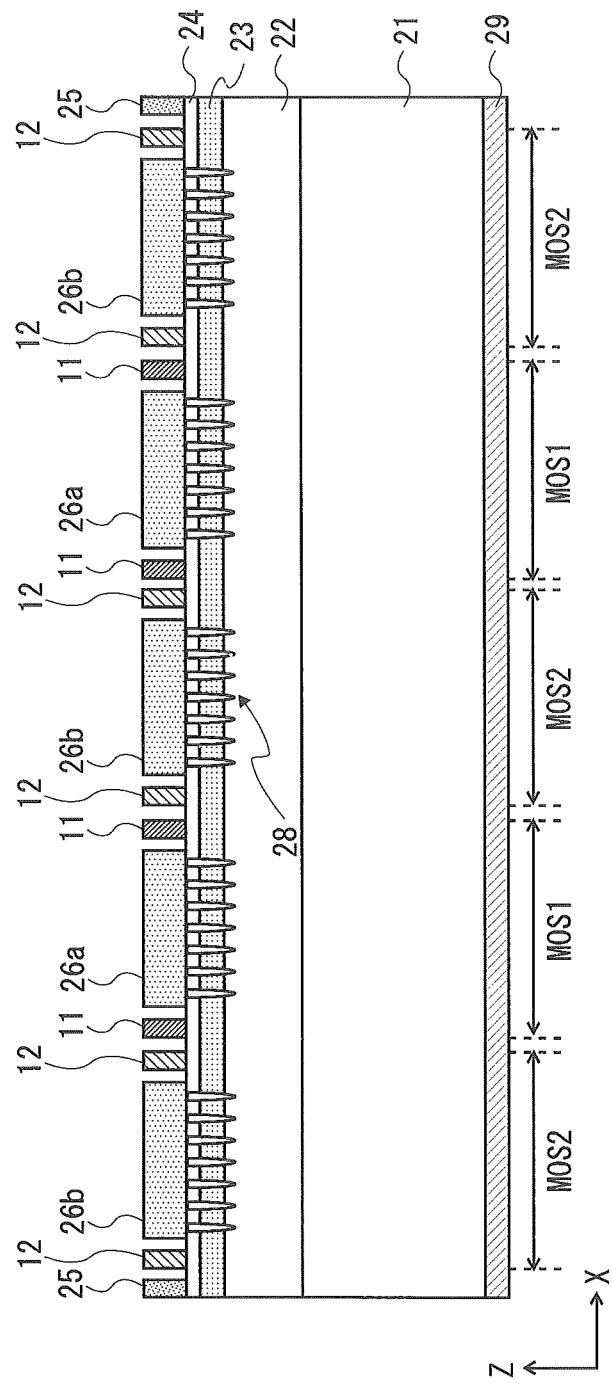
FIG. 4 is a cross-sectional diagram of the semiconductor apparatus taken along the line IV-IV of FIG. 1.
Figure 5:
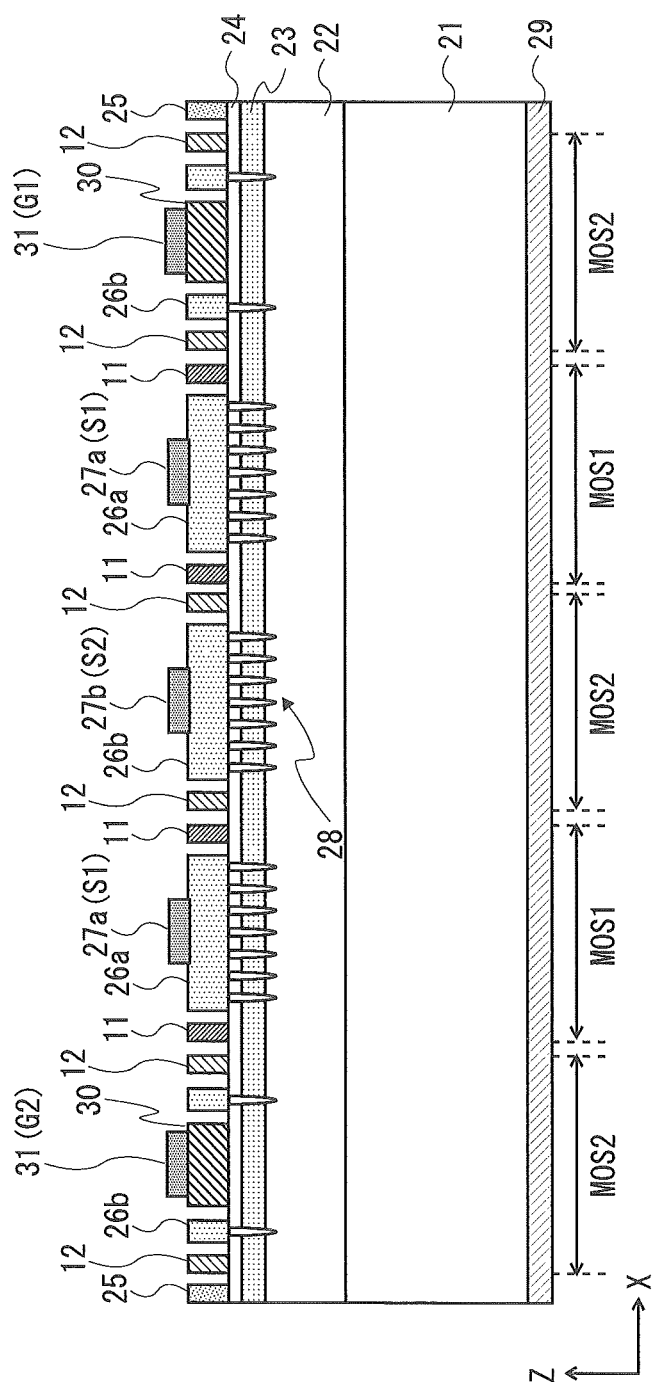
FIG. 5 is a cross-sectional diagram of the semiconductor apparatus taken along the line V-V of FIG. 1.

Next, a configuration of the transistor of the semiconductor apparatus 1 according to the first embodiment shall be explained. FIGS. 3 to 5 are cross-sectional diagrams of the semiconductor apparatus 1 shown in FIG. 1. FIG. 3 is a cross-sectional diagram of the semiconductor apparatus taken along the line III-III of FIG. 1.

The source pads S1 and S2 are arranged on the line III-III shown in FIG. 3. Therefore, in the cross-sectional diagram shown in FIG. 3, the source pads S1 and S2 are illustrated in addition to the first transistor MOS1 and the second transistor MOS2 of the semiconductor apparatus 1 according to the first embodiment.

As shown in FIG. 3, the semiconductor apparatus 1 includes a semiconductor substrate 21, an epitaxial layer 22, a second conductive diffusion layer 23, a first conductive type diffusion layer 24, EQR lines 25, gate lines 11 and 12, source lines 26, source pads 27, vertical transistor structures 28, and a back-metal layer 29.

The semiconductor substrate 21 is, for example, a semiconductor substrate made of, for example, Si. The semiconductor substrate 21 is formed by crystal growth. The semiconductor substrate 21 is not limited to the semiconductor substrate made of Si but may be a compound semiconductor of, for example, GaN, SiC, InP, and GaAs, or their solid solution. In the semiconductor apparatus 1, the semiconductor substrate of a first conductive type is used as the semiconductor substrate 21. Note that when the first conductive type is an n layer, a second conductive type is a p layer, or vice versa.

On the front surface of the semiconductor substrate 14, the epitaxial layer 22 of the first conductive type, a second conductive type diffusion layer 23, and a first conductive type 24 are successively stacked in the Z-direction. The epitaxial layer 22 is formed together with the crystal growth by a method such as diffusion or ion implantation. Both of the second conductive type diffusion layer 23 and the first conductive type diffusion layer 24 are formed by a method such as ion implantation or diffusion into the epitaxial layer 22.

In the first conductive type diffusion layer 24, the second conductive type diffusion layer 23, and the epitaxial layer 22, a plurality of gate trenches that extend from the first conductive type diffusion layer 24 to the epitaxial layer 22 are formed. Further, the vertical transistor structures 28 are formed in this area.

In the gate trench, a gate electrode that is made of polysilicon or the like, a gate insulating film, and an interlayer insulating film (not shown in the drawings) are formed. Moreover, the first conductive type diffusion layer 24 serves as a source region, the second conductive type diffusion layer 23 serves as a channel region (also referred to as a base region), and the first conductive type semiconductor substrate 21 and epitaxial layer 22 serve as a drain region.

In the first area where the first transistor MOS1 is formed, a source line 26a that is connected to the source of the first transistor MOS1 is formed above the area where the vertical transistor structure 28 of the first conductive type diffusion layer 24 is formed. Further, in the second area where the second transistor MOS2 is formed, a source line 26b is formed above the area where the vertical transistor structure 28 of the first conductive type diffusion layer 24 is formed.

The source pad S1 is formed above the source line 26a, and the source pad S2 is formed above the source line 26b. The back-metal layer 29 made of a metal film is provided on a second plane (e.g., a back surface) side that is opposite to a first plane (e.g., a front surface) of the semiconductor substrate 21.

The gate line 11 and the EQR line 25 are arranged in this order as viewed from the source line 26a at an outer side of the source line 26a that is positioned at an outermost side of the semiconductor chip. Further, between the source line 26a and the source line 26b, the gate line 11 is provided to a side closer to the source line 26a, and a gate line 26 is provided to a side closer to the source line 26b.

The back-metal layer 29 is desirably a Ti—Ag or Ti—Ni—Ag metal stack structure, or a Ti—Au or Ti—Ni—Au metal stack structure. In particular, since the back-surface metal resistance significantly affects the RSSON in the MOSFET according to an embodiment, the sheet resistance of the back-surface metal structure is preferably equal to or less than 50 mΩ/sq. More preferably, the sheet resistance is equal to or less than 30 mΩ/sq.

Note that the vertical transistor structure 28 may be a UMOS (U-shape Metal-Oxide-Semiconductor) structure or a DMOS (Double-Diffused Metal-Oxide Semiconductor) structure, which has a structure that allows a current to flow in the direction perpendicular to the source line 26a and the source line 26b disposed on the front surface of the semiconductor chip, and the back metal layer 29 disposed on the back surface of the semiconductor chip.

Next, a cross-sectional structure of the semiconductor apparatus taken along the line IV-IV of FIG. 1 shall be explained. FIG. 4 is a cross-sectional diagram of the semiconductor apparatus taken along the line IV-IV of FIG. 1. The source pads S1 and S2 are not disposed in the semiconductor apparatus 1 taken along the line IV-IV. Therefore, as shown in FIG. 4, in the cross-sectional structure of the semiconductor apparatus 1 taken along the line IV-IV, the source pads 27a and 27b are removed from the cross-sectional structure shown in FIG. 3.

Next, a cross-sectional structure of the semiconductor apparatus taken along the line V-V of FIG. 1 shall be explained. FIG. 5 is a cross-sectional diagram of the semiconductor apparatus taken along the line V-V of FIG. 1. In addition to the source pads S1 and S2, the gate pads G1 and G2 are disposed in the semiconductor apparatus 1 taken along the line V-V. Thus, in the cross-sectional diagram shown in FIG. 5, an oxide film layer 30 is formed in a layer above the first conductive type diffusion layer 24 of the second area that is an outermost area of the semiconductor chip. Further, gate pads 31 are formed in a layer above the oxide film layer 30. The source lines 26b are formed in the areas at both sides of the oxide film layer 30, and the vertical transistor structure 28 is formed below the source line 26b. Note that in the first embodiment, the gate pad 31 that is positioned on the right side of the drawing is the gate pad G1, while the gate pad 31 that is positioned on the left side of the drawing is the gate pad G2.

Figure 6:
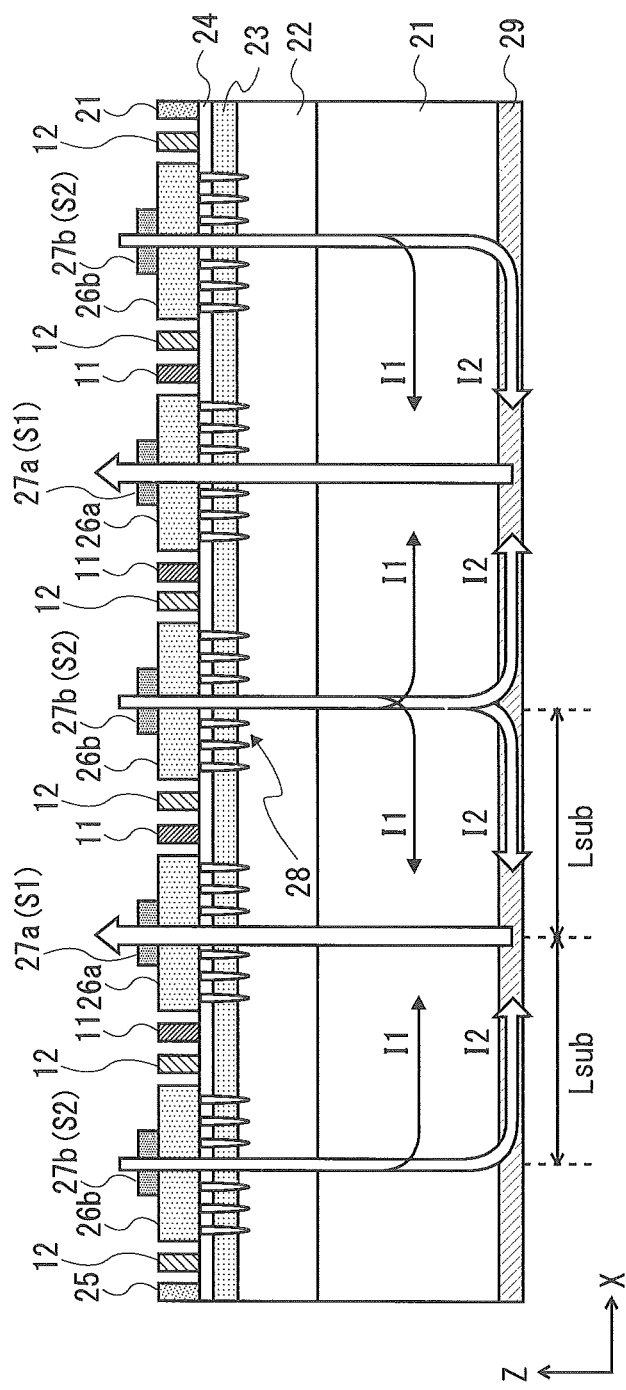
FIG. 6 is a diagram for explaining a current path flowing through the semiconductor apparatus according to the first embodiment.

Next, an operation of the semiconductor apparatus 1 according to the first embodiment shall be explained. FIG. 6 is a diagram for explaining current paths flowing through the semiconductor apparatus 1 according to the first embodiment. Note that in FIG. 6, the current paths are further illustrated in the cross-sectional diagram taken along the line III-III of FIG. 1. As shown in FIG. 6, in the semiconductor apparatus 1 according to the first embodiment, a current flowing into the source of the second transistor MOS2 flows into the source of the first transistor MOS1 via the semiconductor substrate 21 and the back-metal layer 29 that are provided in common with the first transistor MOS1 and the second transistor MOS2.

At this time, as the resistance value of a back-surface resistance R (back-metal) of the back-metal layer 29 is smaller than the resistance value of the chip resistance R (chip) of the semiconductor substrate 21, in the semiconductor apparatus 1 shown in FIG. 6, a current I2 that flows through the back-metal layer 29 will be greater than a current I1 that flows through the semiconductor substrate 21. Further, in the semiconductor apparatus 1 according to the first embodiment, as the numbers of divisions of the first area and the number of divisions of the second area are large, a distance Lsub between the first transistor MOS1 and the second transistor MOS2 is short. Accordingly, in the semiconductor apparatus 1 according to the first embodiment, the distances of the current paths are short, so that the chip resistance (chip) and the back-surface resistance (back-metal) will be small. Further, in the semiconductor apparatus 1 according to the first embodiment, as the number of divisions of the first area and the number of divisions of the second area are large, the number of parallel chip resistances R (chip) and back surface resistances R (back-metal) can be configured as being large. In this way, in the semiconductor apparatus 1 according to the first embodiment, the number of parallel resistances of the current paths in the entire semiconductor chip can be increased, thereby reducing the resistance value of the current paths.

Figure 7:
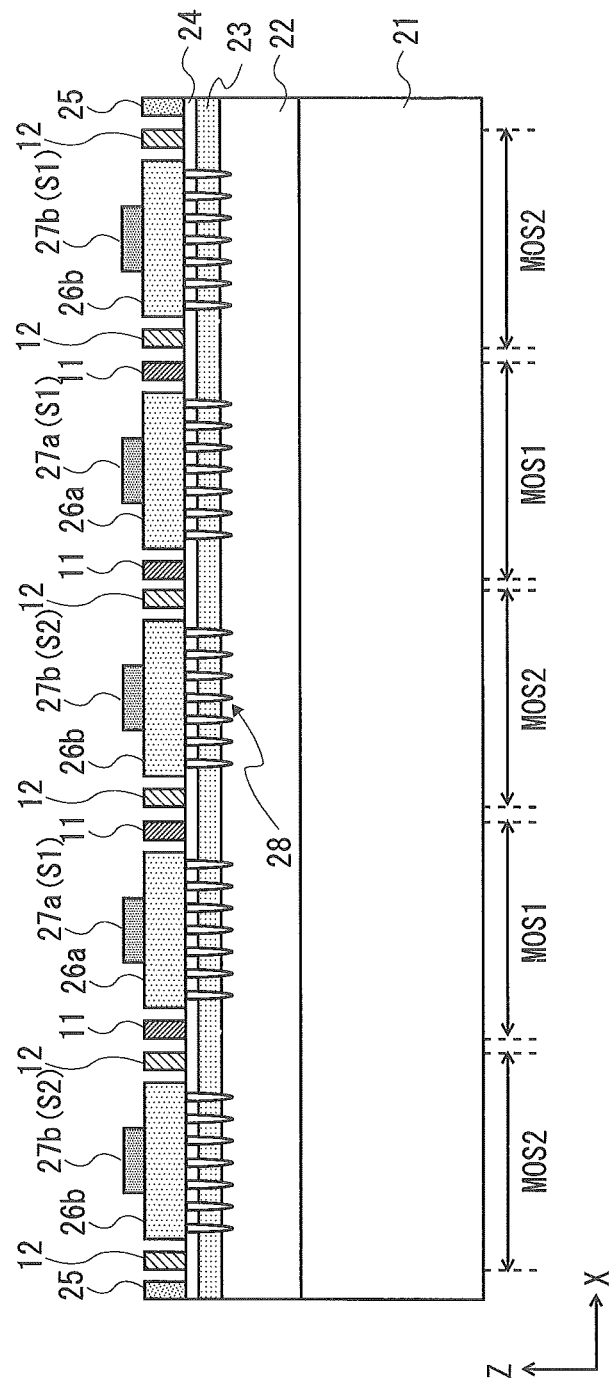
FIG. 7 is a cross-sectional diagram of the semiconductor apparatus taken along the line III-III when a back-metal layer of the semiconductor apparatus according to the first embodiment is removed.

Note that the back-metal layer 29 may be removed from the semiconductor apparatus 1 shown in FIGS. 3 to 5. FIG. 7 is a cross-sectional diagram of the semiconductor apparatus taken along the line III-III when the back-metal layer of the semiconductor apparatus 1 according to the first embodiment is removed. As shown in FIG. 7, although the semiconductor apparatus 1 in this case has a transistor structure and a wiring structure shown in the cross-sectional diagram of FIG. 3, the back-metal layer 29 is not provided.

Figure 8:
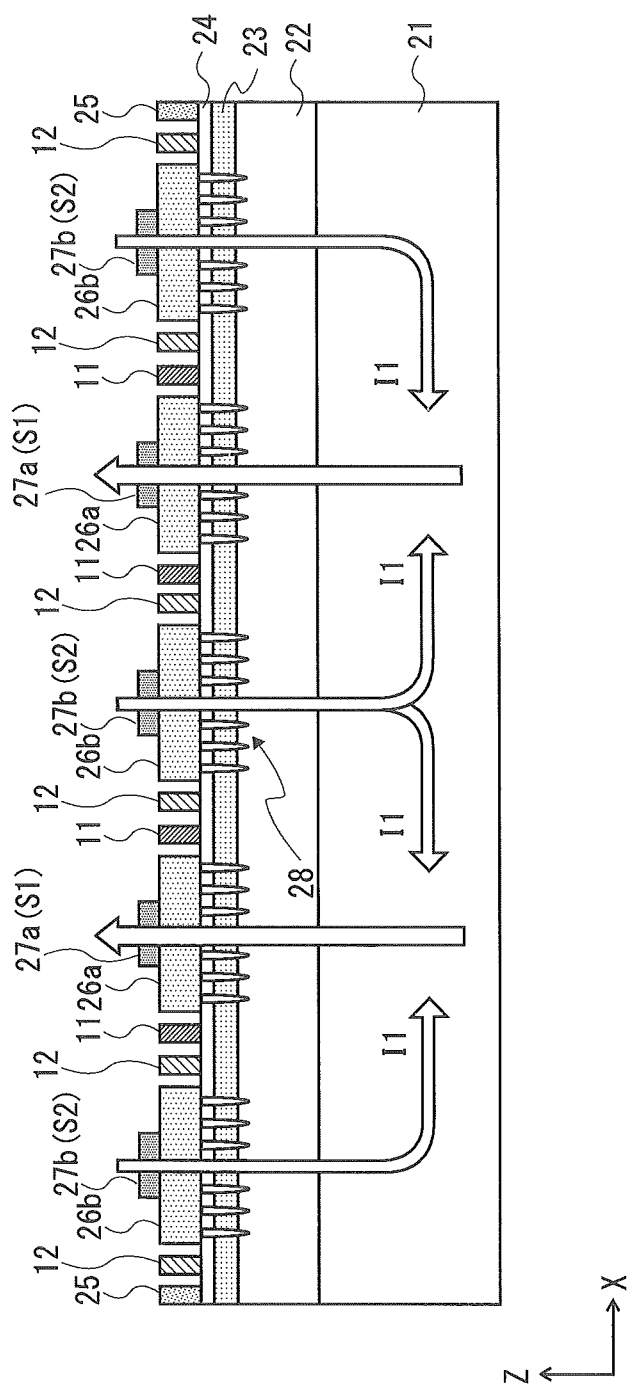
FIG. 8 is a diagram for explaining an operation of the semiconductor apparatus shown in FIG. 7.

Next, current paths of the semiconductor apparatus 1 having the cross-sectional structure shown in FIG. 7 shall be explained. FIG. 8 is a diagram for explaining an operation of the semiconductor apparatus shown in FIG. 7. As shown in FIG. 8, when there is no back-metal layer, the current flowing from the first transistor MOS1 to the second transistor MOS2 will only be the current I1. Even in this case, in the semiconductor apparatus 1 according to the first embodiment, as a distance Lsubg between the first transistor MOS1 and the second transistor MOS2 can be short, the lengths of the current paths from the first transistor MOS1 to the second transistor MOS2 can be short.

Figure 9:
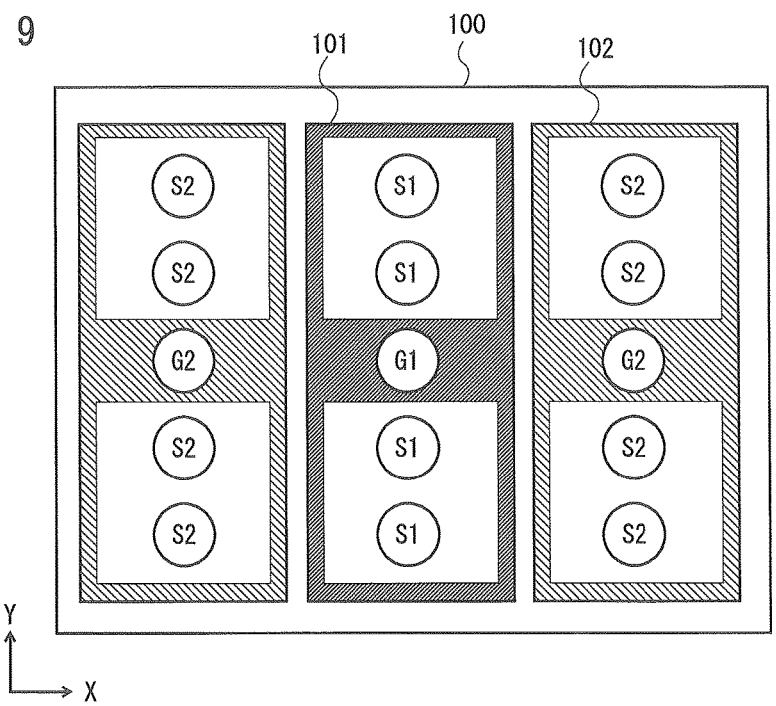
FIG. 9 is a schematic diagram of a layout of a semiconductor apparatus, which is a comparative example of the semiconductor apparatus according to the first embodiment.

As has been explained so far, in the semiconductor apparatus 1 according to the first embodiment, the distance between the transistors is reduced so as to reduce the inter-source electrode resistance RSSON. The inter-source electrode resistance RSSON shall further be explained. FIG. 9 is a schematic diagram of a layout of a semiconductor apparatus 100, which is a comparative example of the semiconductor apparatus 1 according to the first embodiment.

As shown in FIG. 9, the semiconductor apparatus 100 includes a first area (an area surrounded by a gate line 101) in which the first transistor MOS1 is formed and second areas (areas surrounded by a gate line 102) in which the second transistors MOS2 are formed. The semiconductor apparatus 100 has a layout in which one first area is sandwiched by the two second areas.

Figure 10:
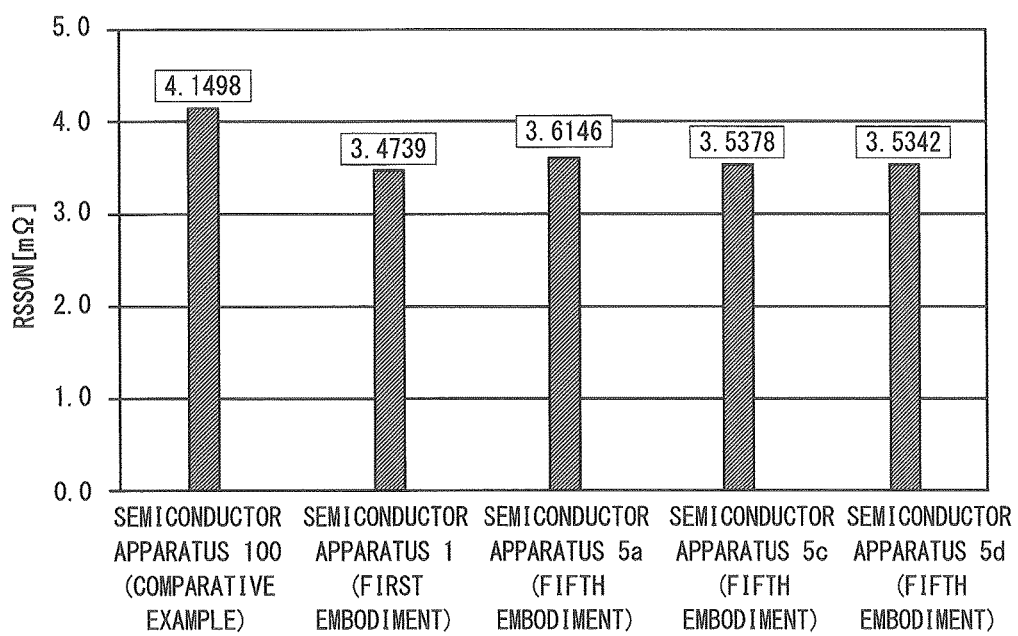
FIG. 10 is a graph for explaining an inter-source electrode voltage of the semiconductor apparatus according to the first embodiment.
Figure 11:
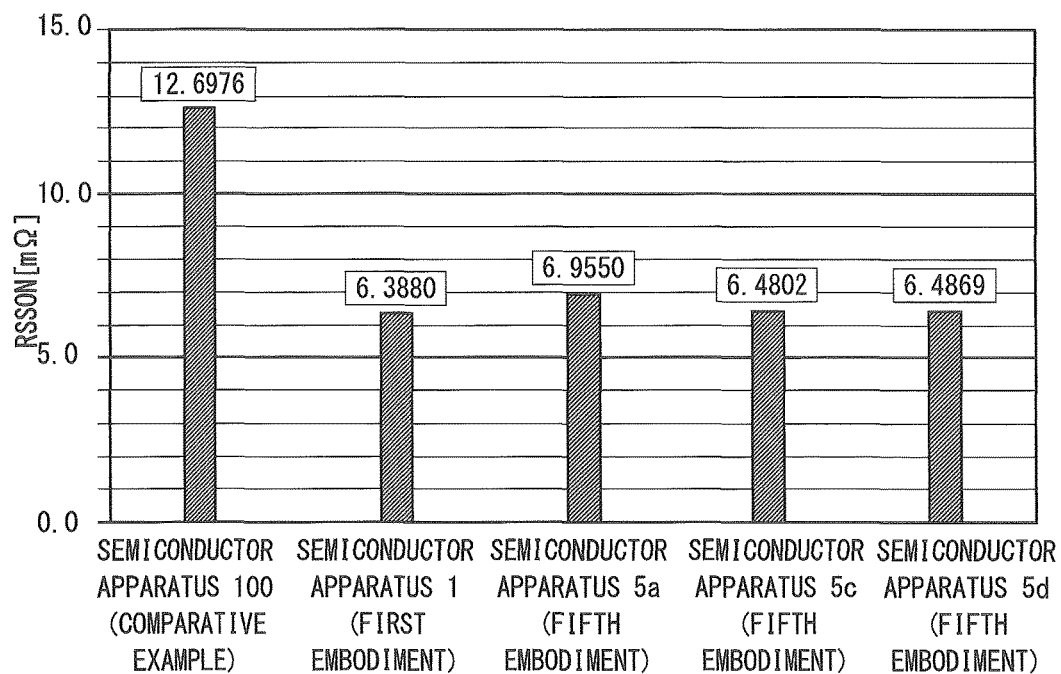
FIG. 11 is a graph for explaining an inter-source electrode voltage of the semiconductor apparatus according to the first embodiment.

Next, FIGS. 10 and 11 show measurement results of the inter-source electrode resistance RSSON in the comparative example shown in FIG. 9 (hereinafter referred to as the semiconductor apparatus 100) and the inter-source electrode resistance RSSON of the semiconductor apparatus 1 according to the first embodiment. Note that FIGS. 10 and 11 also show an inter-source electrode resistance RSSON in a modified example of a layout of the gate pads G1 and G2, which will be explained in a fifth embodiment.

FIG. 10 shows the inter-source electrode resistance RSSON of the semiconductor apparatus in which the back-metal layer is provided on the back surface of the semiconductor chip. As shown in FIG. 10, the inter-source electrode resistance RSSON of the semiconductor apparatus 1 according to the first embodiment is smaller than that of the semiconductor apparatus 100 according to the comparative example. Also in the semiconductor apparatus 5 according to the fifth embodiment, the inter-source electrode resistance RSSON will be smaller than that of the semiconductor apparatus 100 according to the comparative example.

FIG. 11 shows the inter-source electrode resistance RSSON of the semiconductor apparatus in which the back-metal layer is removed from the back surface of the semiconductor chip. As shown in FIG. 11, when the back-metal layer is not included, a difference in the inter-source electrode resistance RSSON between the semiconductor apparatus 1 according to the first embodiment and the semiconductor apparatus 100 according to the comparative example is greater than the example shown in FIG. 10. Moreover, in the semiconductor apparatus 100 according to the comparative example, the inter-source electrode resistance RSSON when the back-metal layer is removed will be about three times more than the inter-source electrode resistance RSSON when the back-metal layer is included. However, in the semiconductor apparatus 1 according to the first embodiment, the inter-source electrode resistance RSSON when the back-metal layer is removed will only be about 1.5 times more than the inter-source-electrode resistance RSSON when the back-metal layer is included.

As described above, in the semiconductor apparatus 1 according to the first embodiment, the first area in which the first transistor MOS1 is formed and the second area in which the second transistor MOS2 is formed are divided in a plurality of areas. In addition, in the semiconductor apparatus 1, the first area and the second area are arranged to be alternately arranged in the X-direction. Also, in the semiconductor apparatus 1, the gate pad G1 and the gate pad G2 are disposed in the second area, which has a total area larger or the number of divisions greater than that of the first area.

In this way, in the semiconductor apparatus 1 according to the first embodiment, an entire active area of the first transistor that is provided in the first area, which has a total area smaller or the number of divisions smaller than that of the first area, can be effectively used. Thus, the semiconductor apparatus 1 according to the first embodiment can reduce the inter-source electrode resistance RSSON.

Further, in the semiconductor apparatus 1 according to the first embodiment, the gate pad G1 and the gate pad G2 are provided in the area along the contour of the semiconductor chip. In this way, in the semiconductor apparatus 1, the source line on the circuit board on which the semiconductor apparatus 1 is mounted can be formed in single-layer wiring. Therefore, in the system incorporating the semiconductor apparatus 1, a wiring resistance on the circuit board can be reduced. Additionally, as the wiring on the circuit board can be simplified, the semiconductor apparatus 1 according to the first embodiment can facilitate implementation.

Moreover, in the semiconductor apparatus 1 according to the first embodiment, the number of divisions of the first area and the number of divisions of the second area can be two or greater. By doing so, in the semiconductor apparatus 1 according to the first embodiment, the distance Lsub between the first transistor MOS1 and the second transistor MOS2 can be reduced, thereby reducing the current paths from the first transistor MOS1 to the second transistor MOS2. Further, in the semiconductor apparatus 1, the number of horizontal parallel paths among the current paths from the first transistor MOS1 to the second transistor MOS2 can be increased, and the resistance values of the current paths can be reduced. In this manner, the semiconductor apparatus 1 according to the first embodiment can reduce the inter-source electrode resistance RSSON.

Second Embodiment

Figure 12:
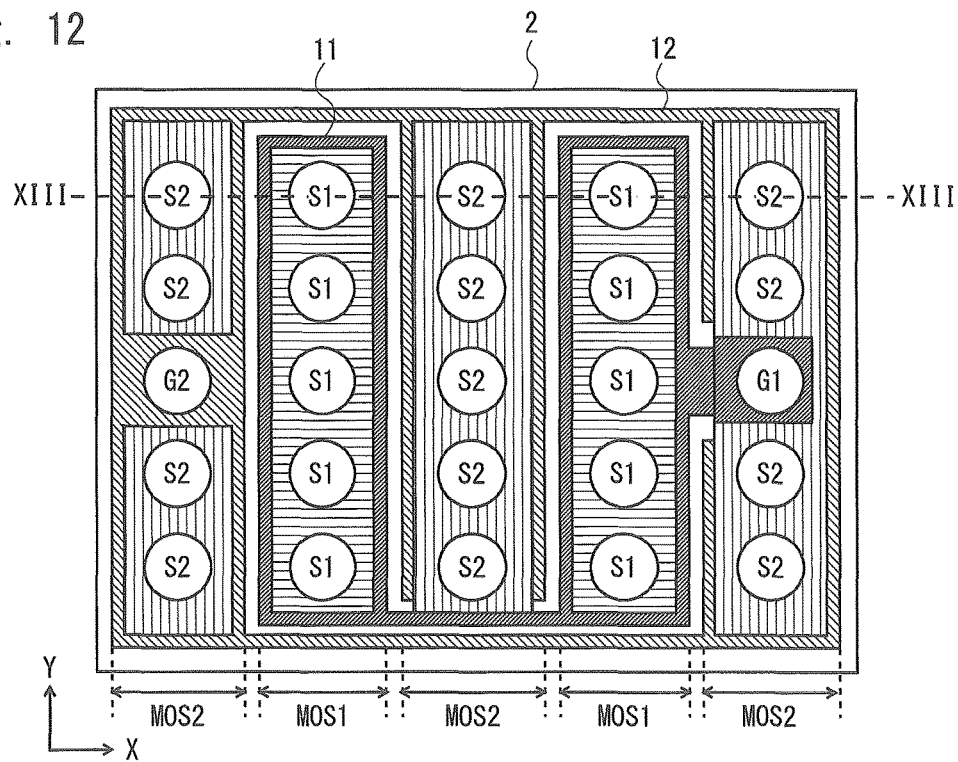
FIG. 12 is a schematic diagram of a layout of a semiconductor apparatus according to a second embodiment.

In a second embodiment, a semiconductor apparatus 2, which is a modified example of the semiconductor apparatus 1 according to the first embodiment, shall be explained. FIG. 12 is a schematic diagram of a layout of the semiconductor apparatus 2 according to the second embodiment.

In the semiconductor apparatus 1 according to the first embodiment, the trench gate electrodes that are provided in the active areas of the transistors formed in the first and second areas are arranged in the Y-direction. Meanwhile, in the semiconductor apparatus 2 according to the second embodiment, the trench gate electrodes that are provided in the active area of the first area are formed to extend in the first direction (e.g., the X-direction), and the trench gate electrodes that are provided in the active area of the second area are formed to extend in the second direction. In FIG. 12, the trench gate electrodes are indicated by vertical lines in the area surrounded by the gate line 11 and the horizontal lines in the area surrounded by the gate line 12.

Figure 13:
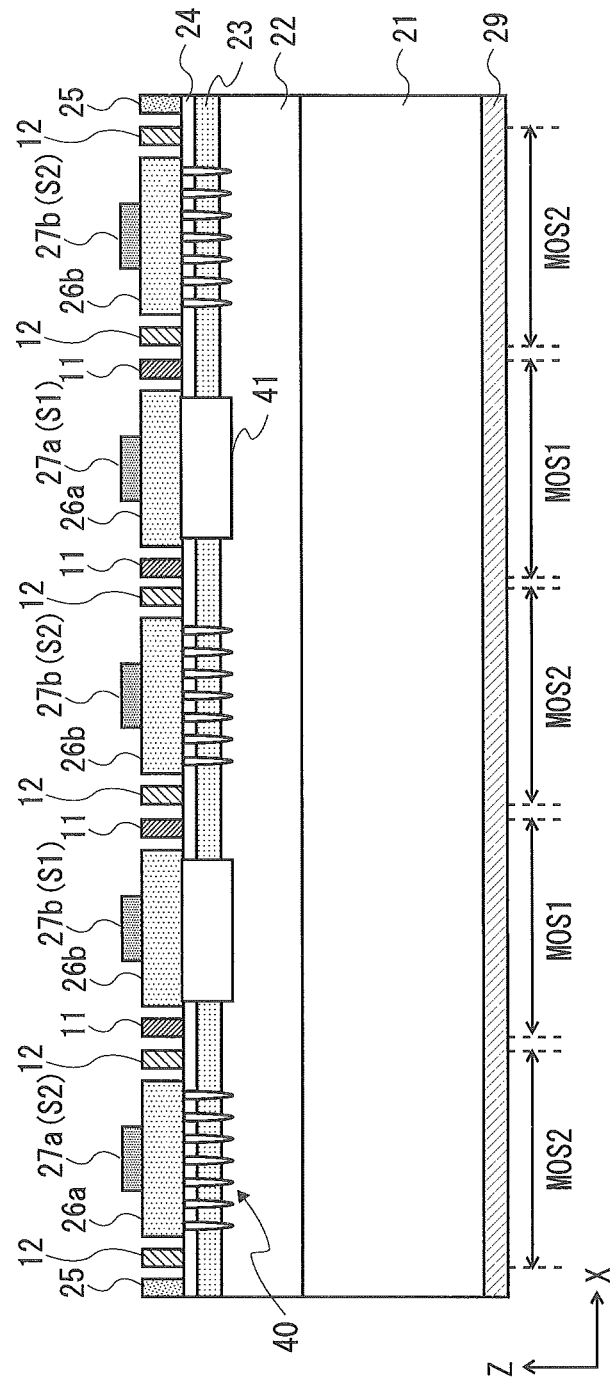
FIG. 13 is a cross-sectional diagram of a semiconductor apparatus taken along the line XIII-XIII of FIG. 12.

FIG. 13 is a cross-sectional diagram of the semiconductor apparatus taken along the line XIII-XIII of FIG. 12. In the cross-sectional diagram along the trench gate electrodes of the semiconductor apparatus 2 according to the second embodiment shown in FIG. 13, a trench gate electrode 40 that is provided below the source line of the first transistor MOS1 is substantially rectangular. Meanwhile, a trench gate electrode 41 that is provided below the source line of the second transistor MOS2 of the semiconductor apparatus 2 has a shape that is formed by being into a plurality of trenches.

As described above, in the semiconductor apparatus 2 according to the second embodiment, a direction in which the trench gate electrodes formed in the first area extend is orthogonal to a direction in which the trench gate electrodes formed in the second area. Thus, the semiconductor apparatus 2 according to the second embodiment can equalize the stress inside the semiconductor chip and reduce warpage of the semiconductor chip. The greater the number of divisions of the first and second areas, the longer the semiconductor chip becomes in the X-direction. The warpage associated with non-uniform in-plane stress of the semiconductor chip is thus a major problem. Therefore, equalizing the in-plane stress of the semiconductor chip to reduce the warpage produces a large effect, as in the semiconductor chip 2.

Third Embodiment

Figure 14:
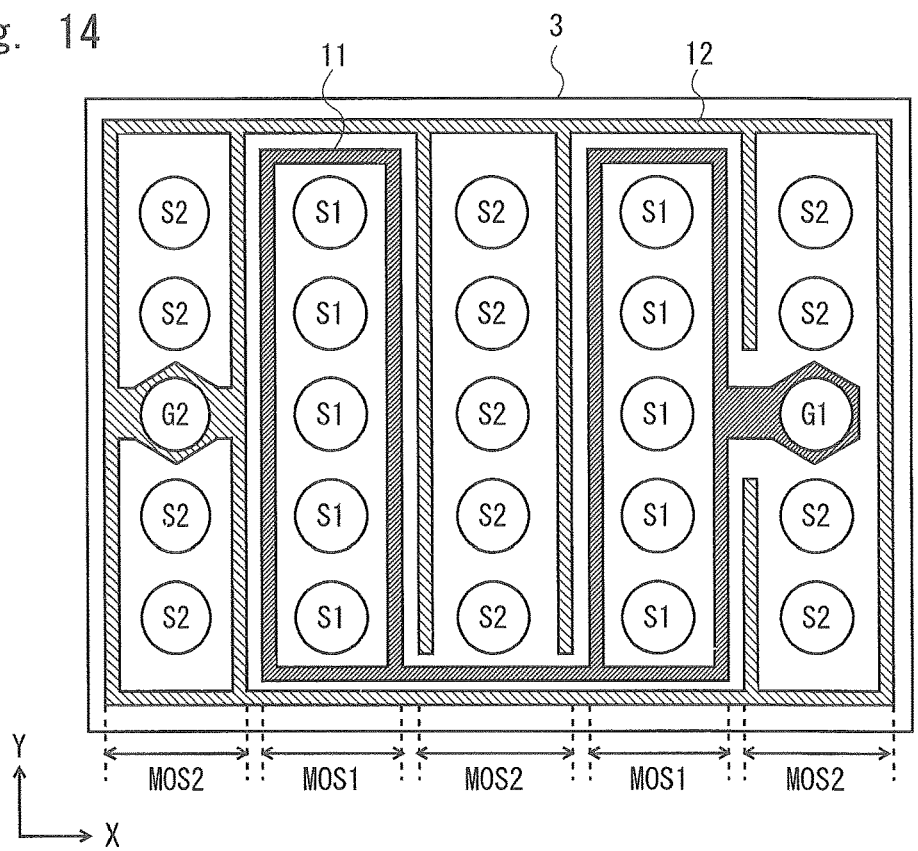
FIG. 14 is a schematic diagram of a layout of a semiconductor apparatus according to a third embodiment.

In a third embodiment, a semiconductor apparatus 3, which is a modified example of the semiconductor apparatus 1 according to the first embodiment, shall be explained. FIG. 14 is a schematic diagram of a layout of the semiconductor apparatus 3 according to the third embodiment.

As shown in FIG. 14, in the semiconductor apparatus 3 according to the third embodiment, the gate pad G1 and the gate pad G2 are polygonal. More specifically, in the semiconductor apparatus 3, the wiring layer constituting the gate pads G1 and G2 is polygonal with more number of corners than four corners. In the example shown in FIG. 14, the gate pads G1 and G2 are hexagonal.

Figure 15:
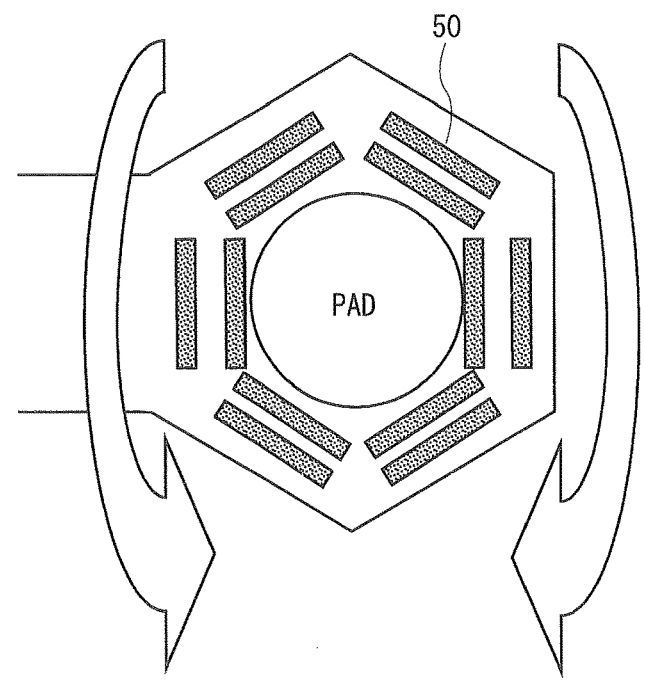
FIG. 15 is a schematic diagram of a layout of a gate pad part of the semiconductor apparatus according to the third embodiment.

FIG. 15 is a schematic diagram of a layout of a gate pad part of the semiconductor apparatus according to the third embodiment so as to further explain the shape of the gate pad. FIG. 15 illustrates the shape of the gate pad G2. The source line is disposed around the wiring layer constituting the gate pad. The polygonal gate pad enables the source line around the gate pad line to have a shape with gentle angled corners to suit the shape of the gate pad. Note that vias 50 are provided at a lower part of the gate pad line to ensure electrical connections with the wiring thereunder.

Thus, in the semiconductor apparatus 3 according to the third embodiment, it is possible to improve the efficiency of a flow of current in the source lines that are disposed around the gate pads so as to reduce the resistance value of the source line. Further, by the smooth shapes of the corners of the source lines, concentration of current can be alleviated, thereby reducing damage of the wiring by electromigration.

Fourth Embodiment

Figure 16:
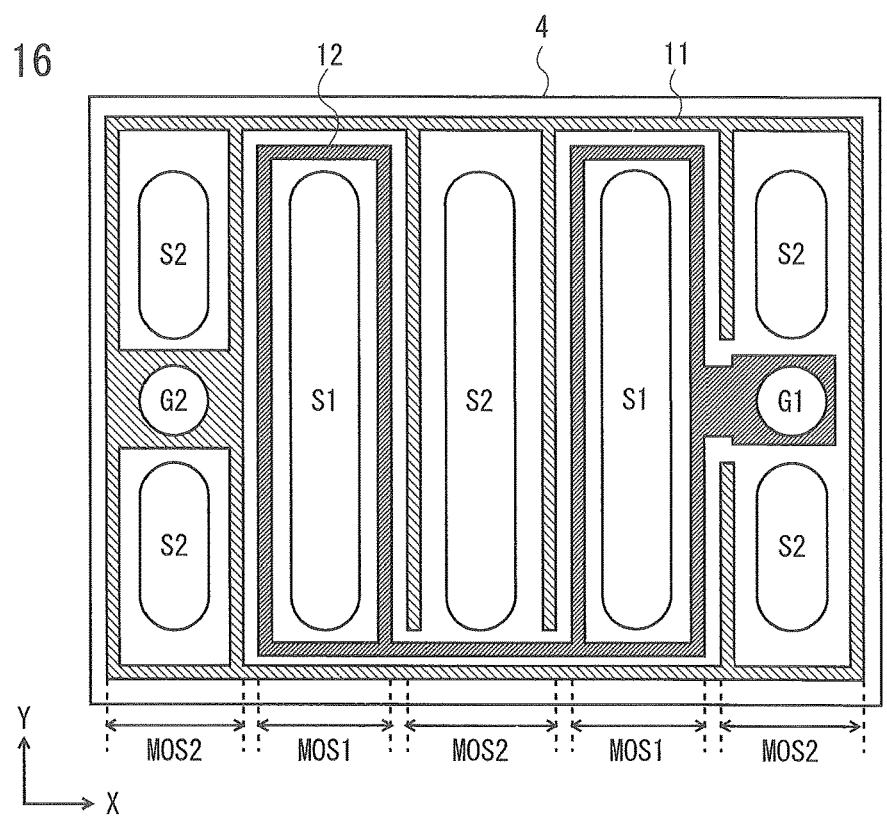
FIG. 16 is a schematic diagram of a layout of a semiconductor apparatus according to a fourth embodiment.

In a fourth embodiment, a semiconductor apparatus 4, which is a modified example of the semiconductor apparatus 1 according to the first embodiment, shall be explained. FIG. 16 is a schematic diagram of a layout of the semiconductor apparatus 4 according to the fourth embodiment. As shown in FIG. 16, in the semiconductor apparatus 4 according to the fourth embodiment, the source pads S1 and S2 have continuous shapes in each of the divided areas.

By the continuous shapes of the source pads S1 and S2 in each of the divided areas in this way, the contact area between the source pads S1 and S2 and the patterns on the circuit board increases, thereby reducing the inter-source electrode resistance RSSON.

Fifth Embodiment

In a fifth embodiment, a semiconductor apparatus in which the arrangement of the gate pads and gate lines of the semiconductor apparatus 1 according to the first embodiment are changed shall be explained. Firstly, FIGS. 17 to 22 are schematic diagrams of layouts of semiconductor apparatuses 5a to 5f according to the fifth embodiment with different arrangements of the gate lines.

Figure 17:
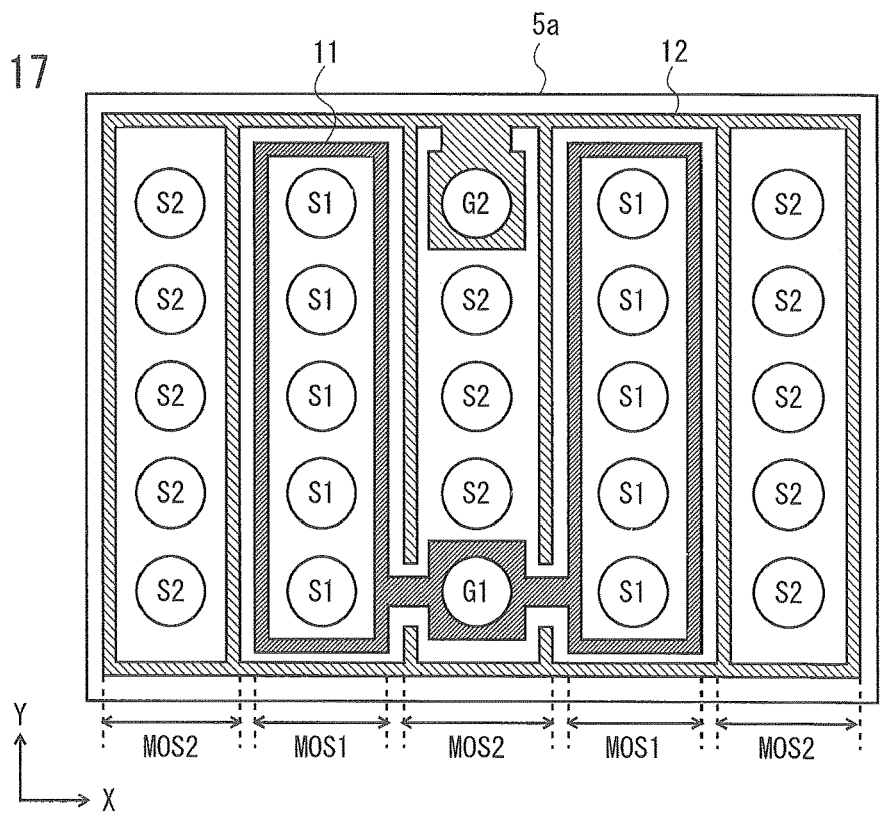
FIG. 17 is a schematic diagram of a first example of a layout of a semiconductor apparatus according to a fifth embodiment.

In the semiconductor apparatus 5a shown in FIG. 17, the gate pads G1 and G2 are disposed in the middle second area among the areas into which the second area is divided by three. That is, in the example shown in FIG. 17, the gate pads G1 and G2 are disposed in the same source pad sequence among the plurality of source pad sequences. Further, as shown in FIG. 17, also in the semiconductor apparatus 5a, the gate pads G1 and G2 are disposed at positions closest to the contour of the semiconductor chip.

Figure 18:
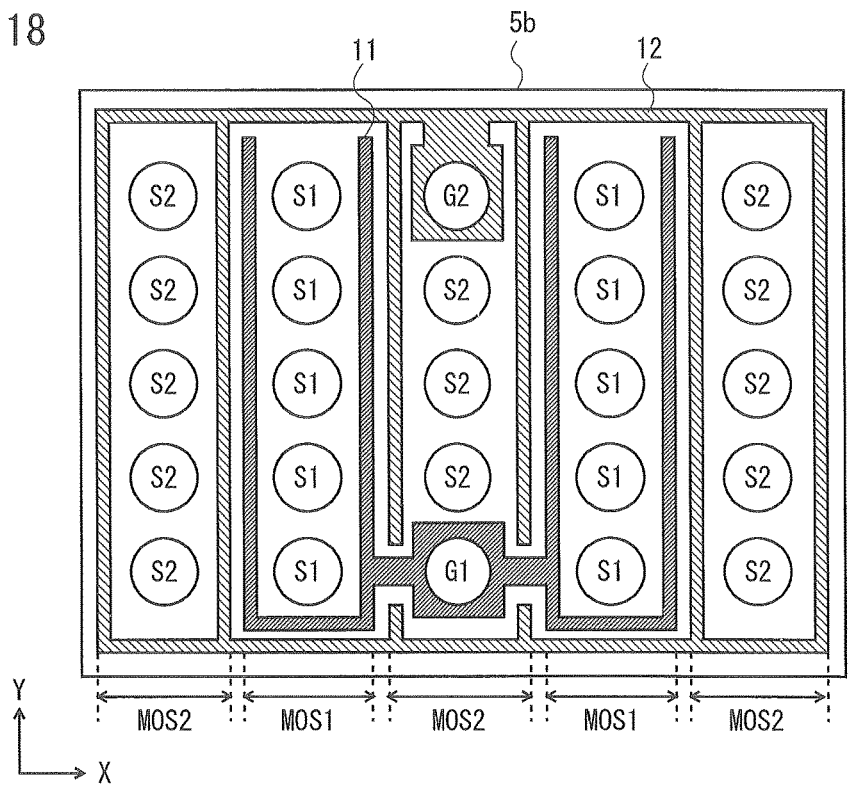
FIG. 18 is a schematic diagram of a second example of the layout of the semiconductor apparatus according to the fifth embodiment.

In the semiconductor apparatus 5b shown in FIG. 18, the portion of the gate line 11 of the semiconductor apparatus 5a shown in FIG. 17 that is in the upper part of FIG. 17 is removed, and the first areas are not surrounded by the gate line 11.

Figure 19:
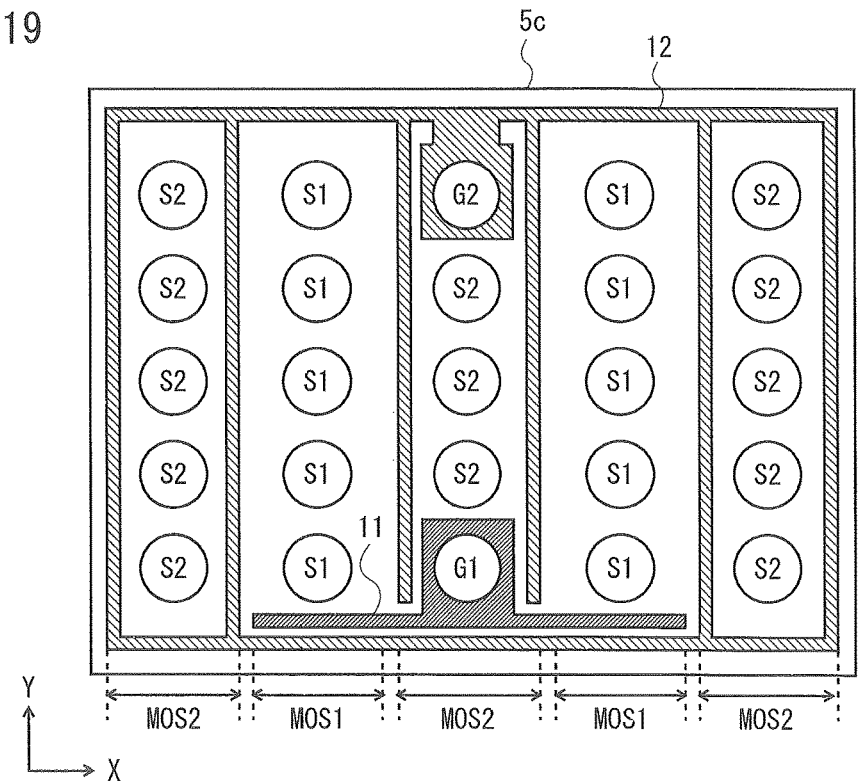
FIG. 19 is a schematic diagram of a third example of the layout of the semiconductor apparatus according to the fifth embodiment.

In the semiconductor apparatus 5c shown in FIG. 19, the gate line 11 of the semiconductor apparatus 5b shown in FIG. 18 arise provided only in the lower part of the FIG. 18 in the first area.

Figure 20:
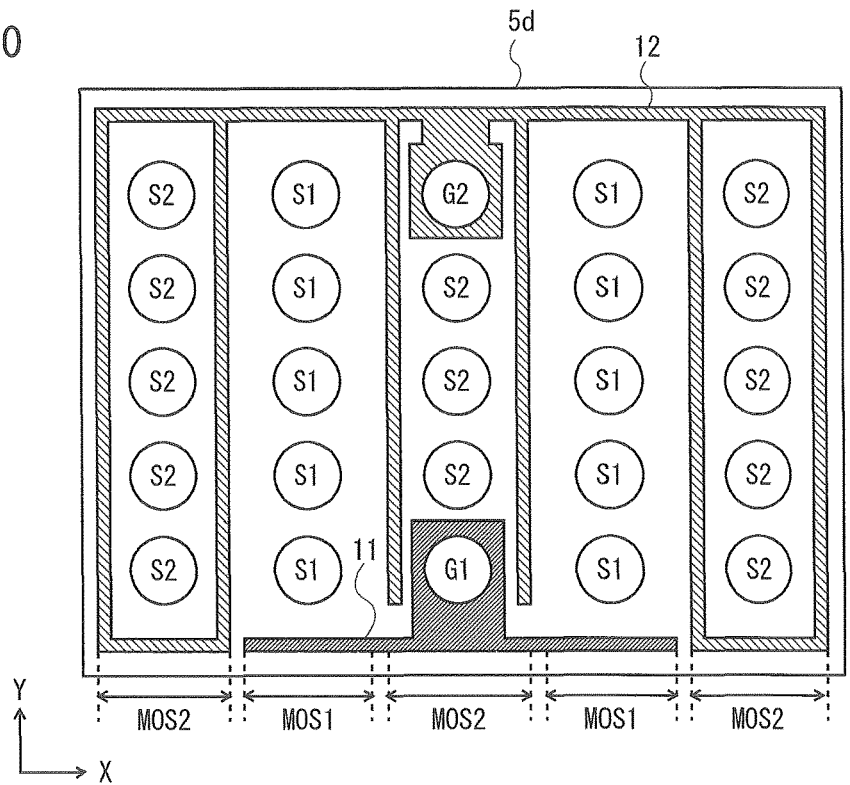
FIG. 20 is a schematic diagram of a fourth example of the layout of the semiconductor apparatus according to the fifth embodiment.

In the semiconductor apparatus 5d shown in FIG. 20, the portion of the gate line 12 of the semiconductor apparatus 5c shown in FIG. 19 that faces the gate line 11 is removed.

Figure 21:
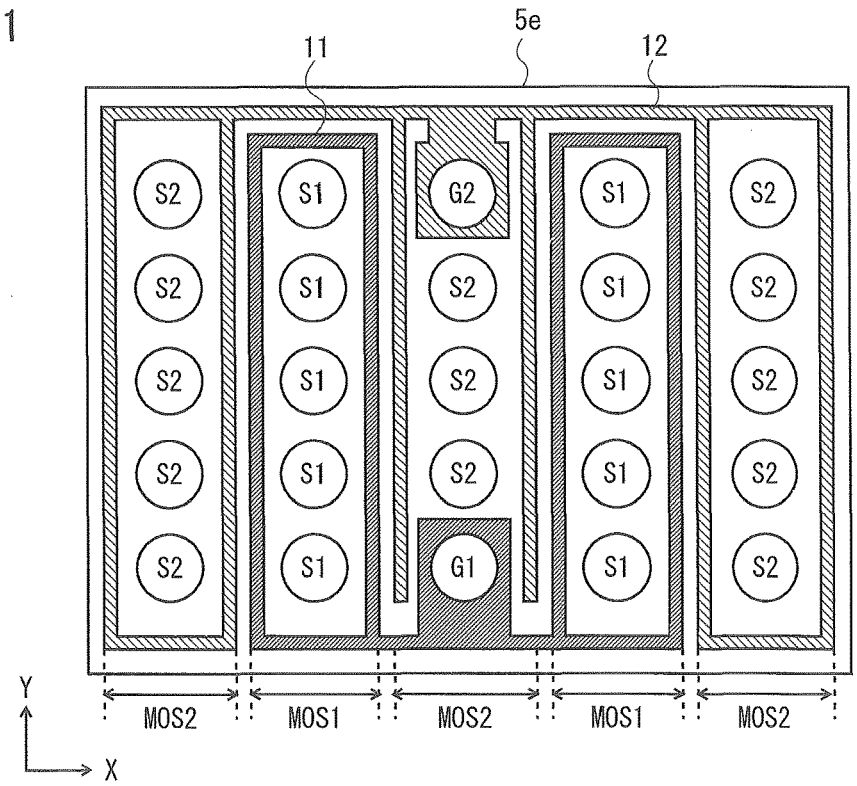
FIG. 21 is a schematic diagram of a fifth example of the layout of the semiconductor apparatus according to the fifth embodiment.

In the semiconductor apparatus 5e shown in FIG. 21, the portion of the gate line 12 of the semiconductor apparatus 5c shown in FIG. 17 that faces the gate line 11 is removed.

Figure 22:
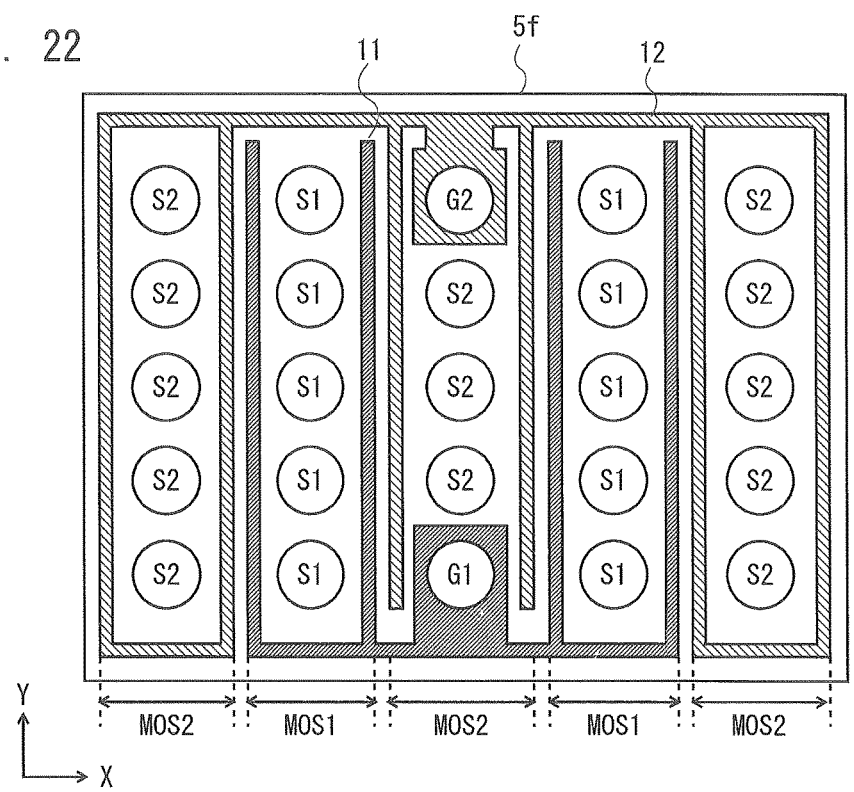
FIG. 22 is a schematic diagram of a sixth example of the layout of the semiconductor apparatus according to the fifth embodiment.

In the semiconductor apparatus 5f shown in FIG. 22, the portion of the gate line 11 of the semiconductor apparatus 5e shown in FIG. 21 that is in the upper part of the drawing is removed, and the first areas are not surrounded by the gate line 11.

Figure 23:
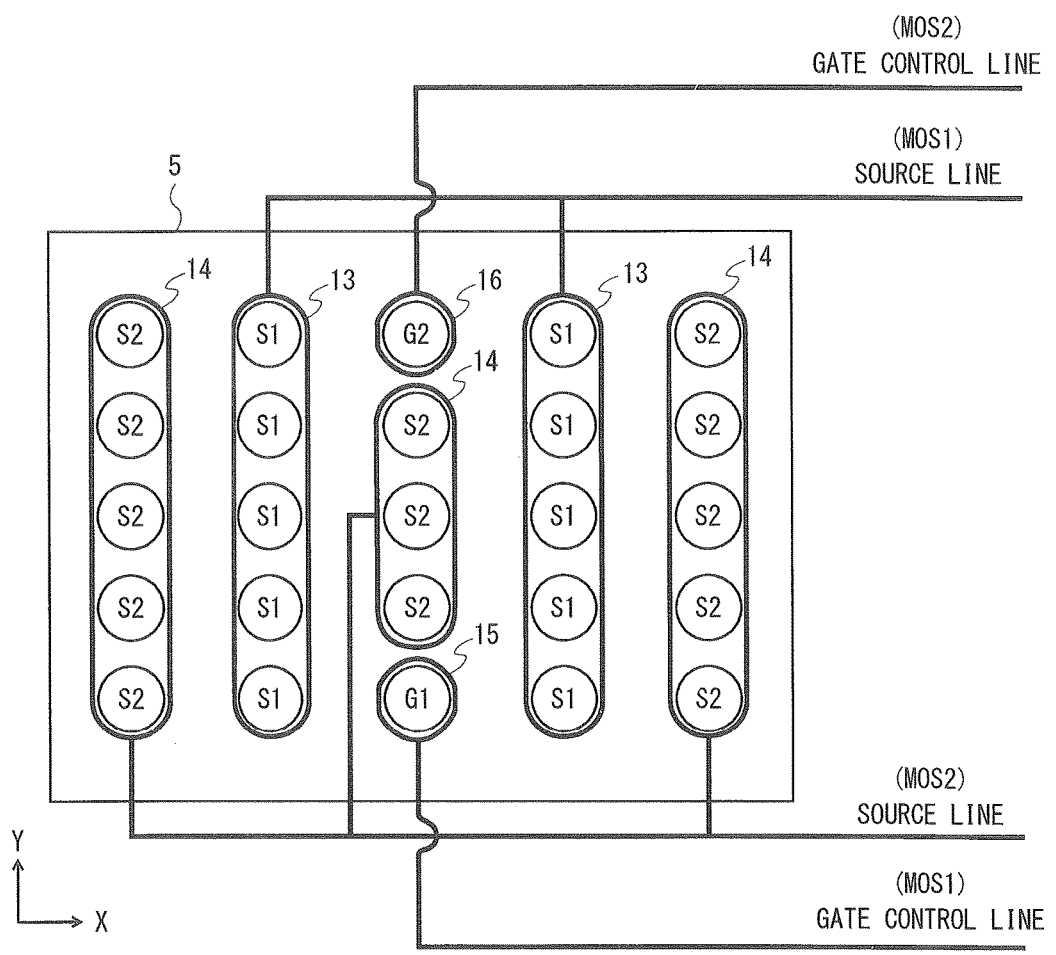
FIG. 23 is a schematic diagram for explaining a mounted state of the semiconductor apparatus shown in FIGS. 17 to 22.

FIG. 23 is a schematic diagram for explaining a mounted state of the semiconductor apparatuses 5a to 5f shown in FIGS. 17 to 22. As shown in FIG. 23, also in the boards on which the semiconductor apparatuses 5a to 5f are mounted, the source line on the circuit board can be wired not to cross another source line. Meanwhile, in the circuit boards on which the semiconductor apparatuses 5a to 5f are mounted, the gate line needs to be multi-layer wiring so that the gate line cross the source line.

Figure 24:
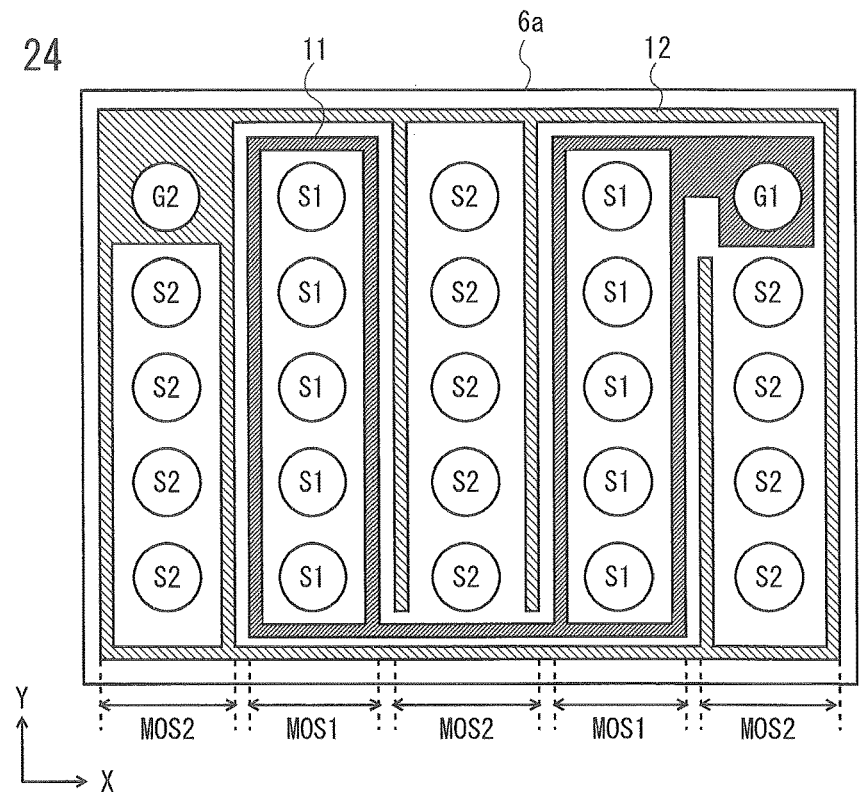
FIG. 24 is a schematic diagram of a seventh example of the layout of the semiconductor apparatus according to the fifth embodiment.
Figure 25:
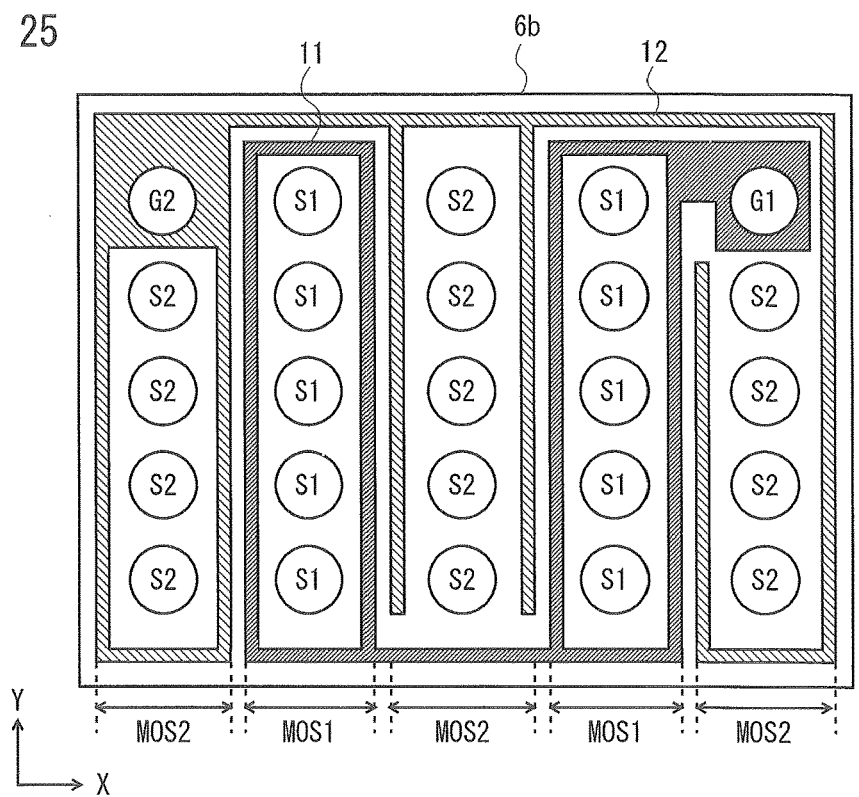
FIG. 25 is a schematic diagram of an eighth example of the layout of the semiconductor apparatus according to the fifth embodiment.

Next, FIGS. 24 and 25 are schematic diagrams of layouts of semiconductor apparatuses 6a and 6b according to the fifth embodiment in which the positions of the gate pads are changed.

In the semiconductor apparatus 6a shown in FIG. 24, the gate pads G1 and G2 of the semiconductor apparatus 1 are moved to the positions of the top source pads in the drawing.

In the semiconductor apparatus 6a shown in FIG. 25, the portion of the gate line 12 of the semiconductor apparatus 6a shown in FIG. 24 that faces the gate line 11 is removed.

Figure 26:
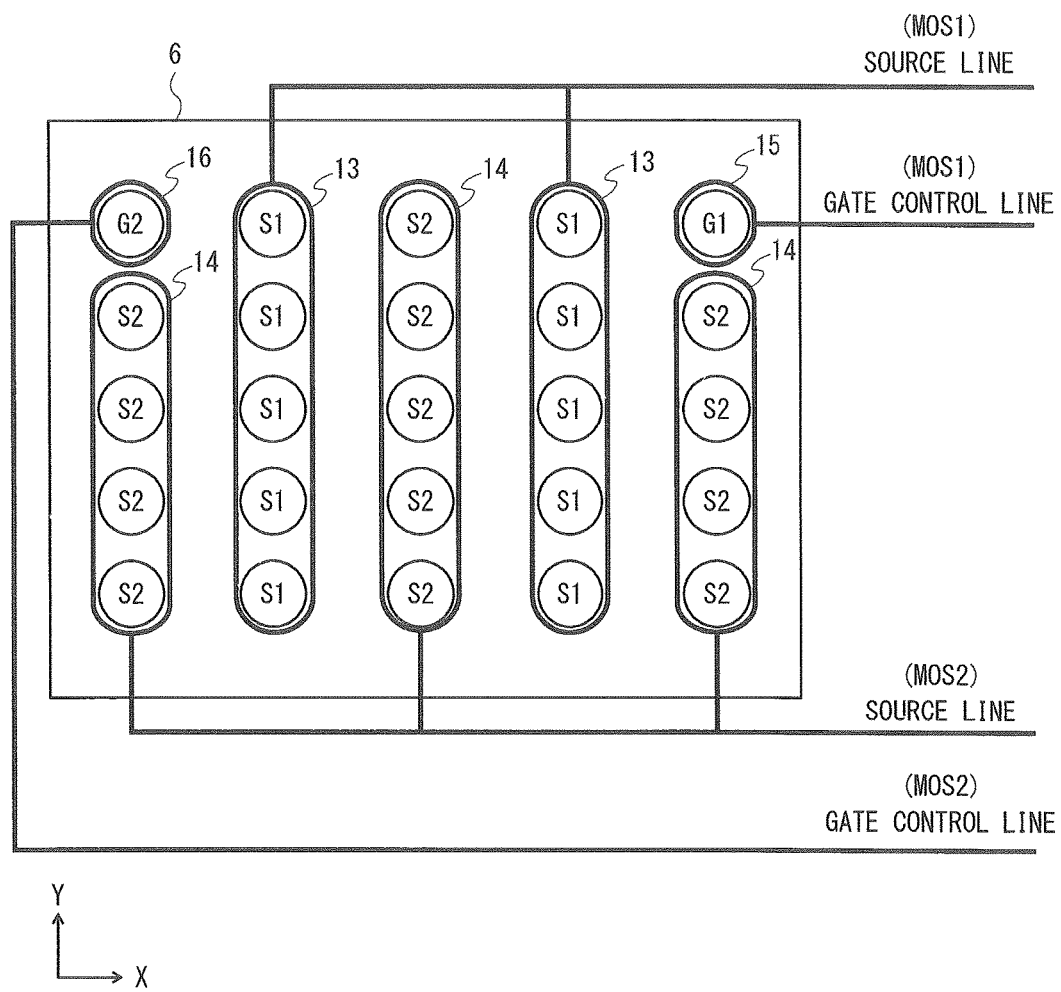
FIG. 26 is a schematic diagram for explaining a mounted state of the semiconductor apparatus shown in FIGS. 24 and 25.

FIG. 26 is a schematic diagram for explaining mounted states of the semiconductor apparatuses 6a and 6b shown in FIGS. 24 and 25. As shown in FIG. 26, also in the boards on which the semiconductor apparatuses 6a and 6b are mounted, the source lines on the circuit boards can be wired not to cross another source line. Further, in the circuit boards on which the semiconductor apparatuses 6a and 6b are mounted, the gate line can be single-layer wiring without crossing the source line and another gate line.

Figure 27:
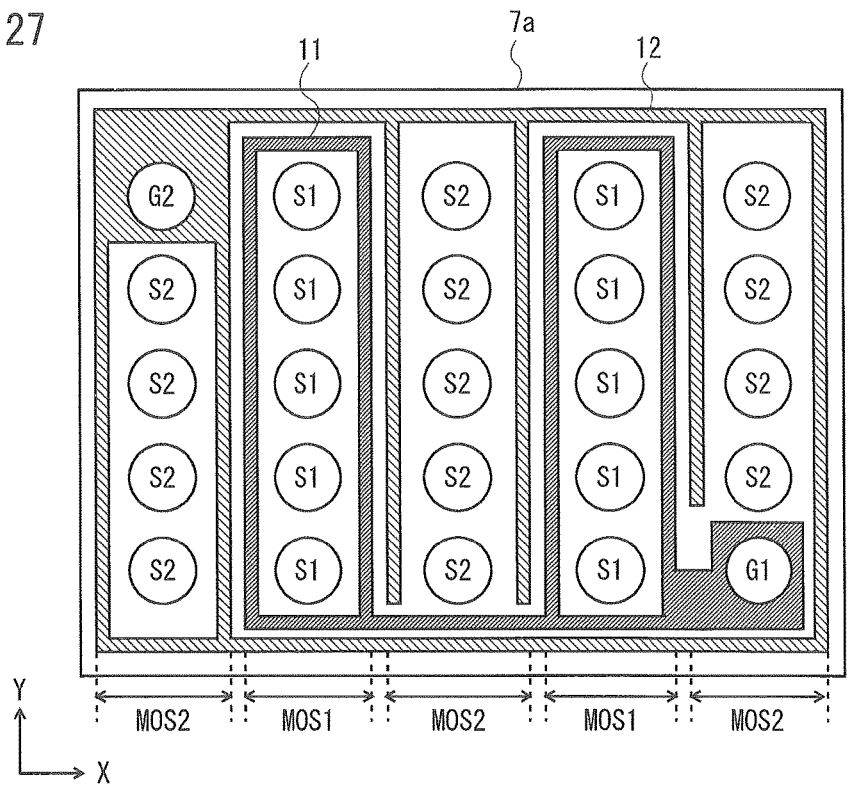
FIG. 27 is a schematic diagram of a ninth example of the layout of the semiconductor apparatus according to the fifth embodiment.
Figure 28:
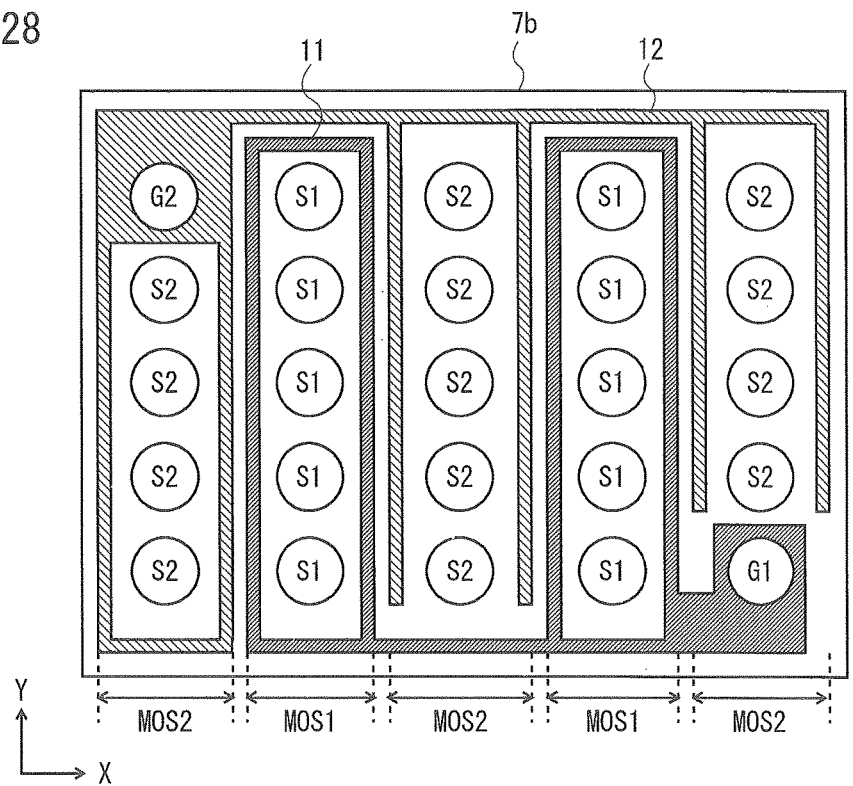
FIG. 28 is a schematic diagram of a tenth example of the layout of the semiconductor apparatus according to the fifth embodiment.

Next, FIGS. 27 and 28 are schematic diagrams of layouts of semiconductor apparatuses 7a and 7b according to the fifth embodiment with different positions of gate pads.

In the semiconductor apparatus 7a shown in FIG. 27, the gate pads G1 and G2 of the semiconductor apparatus 1 are disposed diagonally on the semiconductor chip.

In the semiconductor apparatus 7b shown in FIG. 28, the portion of the gate line 12 of the semiconductor apparatus 7a shown in FIG. 27 that faces the gate line 11 is removed.

Figure 29:
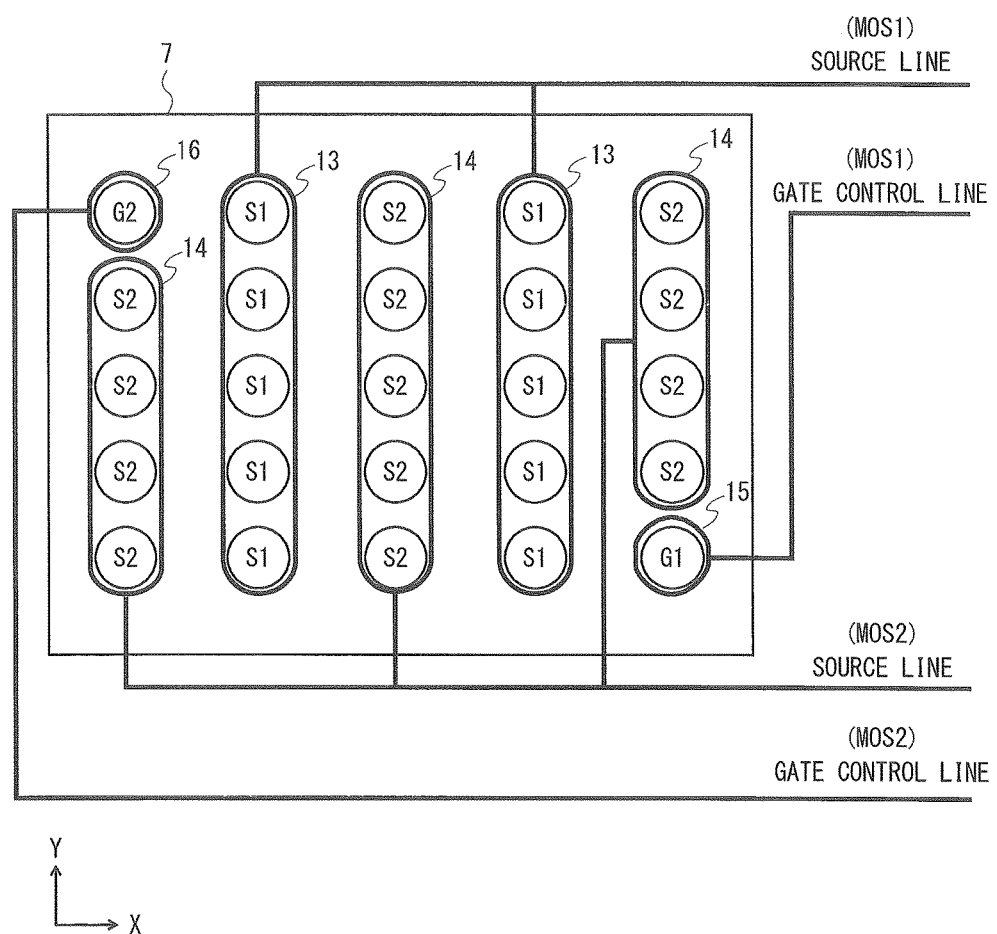
FIG. 29 is a schematic diagram for explaining a mounted state of the semiconductor apparatus shown in FIGS. 27 and 28.

FIG. 29 is a schematic diagram for explaining a mounted state of the semiconductor apparatuses 7a and 7b shown in FIGS. 27 and 28. As shown in FIG. 29, also in the boards on which the semiconductor apparatuses 7a and 7b are mounted, the source lines on the circuit boards can be wired not to cross another source line. Further, in the circuit boards on which the semiconductor apparatuses 7a and 7b are mounted, the gate line can be single-layer wiring without crossing the source line and another gate line.

In the fifth embodiment, the modified example of the arrangement of the gate line and the gate pads of the semiconductor apparatus according to the first embodiment has been explained. Even with such a change, as shown in FIGS. 10 and 11, the inter-source electrode resistance RSSON will not be greatly different from the inter-source electrode resistance RSSON in the semiconductor apparatus 1 according to the first embodiment.

Sixth Embodiment

In a sixth embodiment, an example in which the number of divisions of the areas in the semiconductor apparatus 1 according to the first embodiment is increased shall be explained. Firstly, FIGS. 30 to 33 are schematic diagrams of a layout of a semiconductor apparatus when the number of divisions of the first area is three and the number of divisions of the second area is four.

Figure 30:
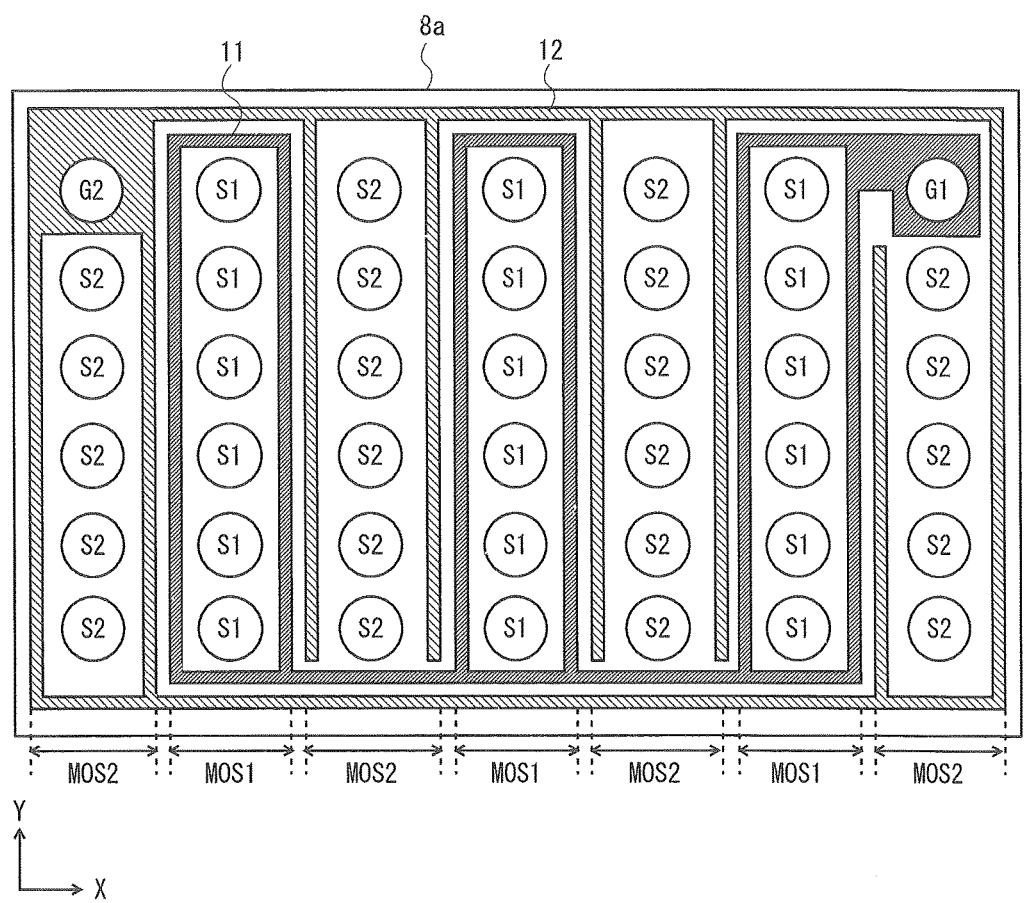
FIG. 30 is a schematic diagram of a first example of a layout of a semiconductor apparatus according to a sixth embodiment.
Figure 31:
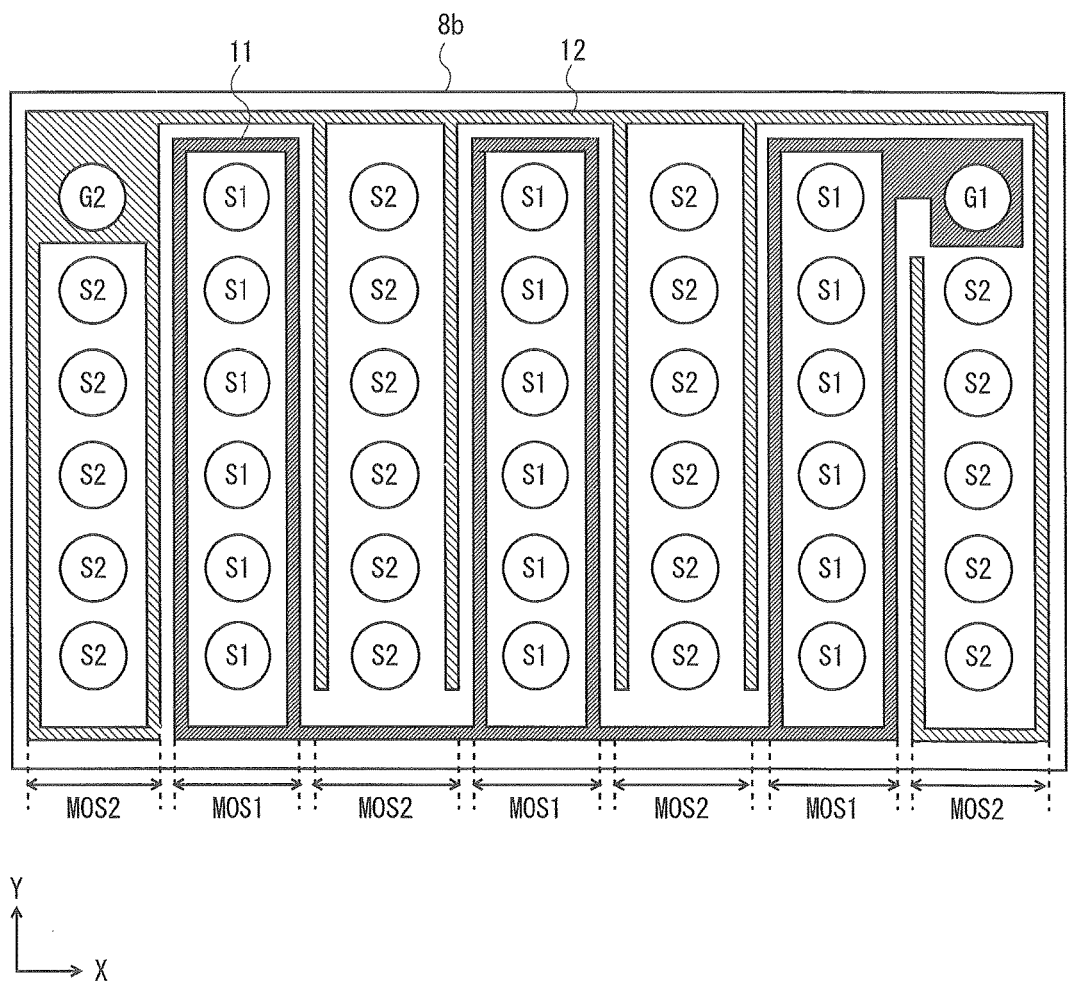
FIG. 31 is a schematic diagram of a second example of the layout of the semiconductor apparatus according to the sixth embodiment.

In the examples shown in FIGS. 30 and 31, the gate pads are disposed in the upper part of the drawing. Specifically, in the example shown in FIG. 30, the number of divided areas of the semiconductor apparatus 6a shown in FIG. 24 is seven. Moreover, in the example shown in FIG. 31, the number of divided areas of the semiconductor apparatus 6b shown in FIG. 25 is seven.

Figure 32:
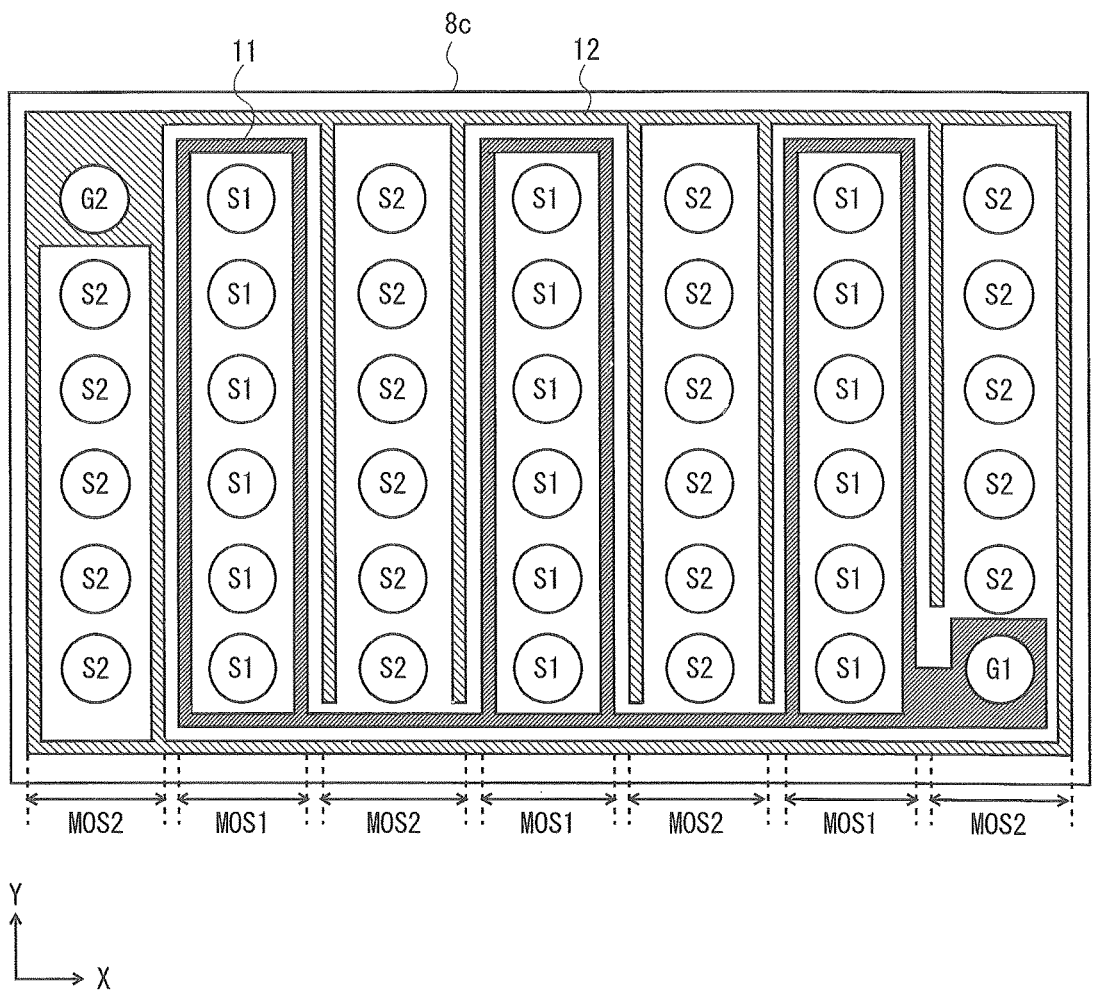
FIG. 32 is a schematic diagram of a third example of the layout of the semiconductor apparatus according to the sixth embodiment.
Figure 33:
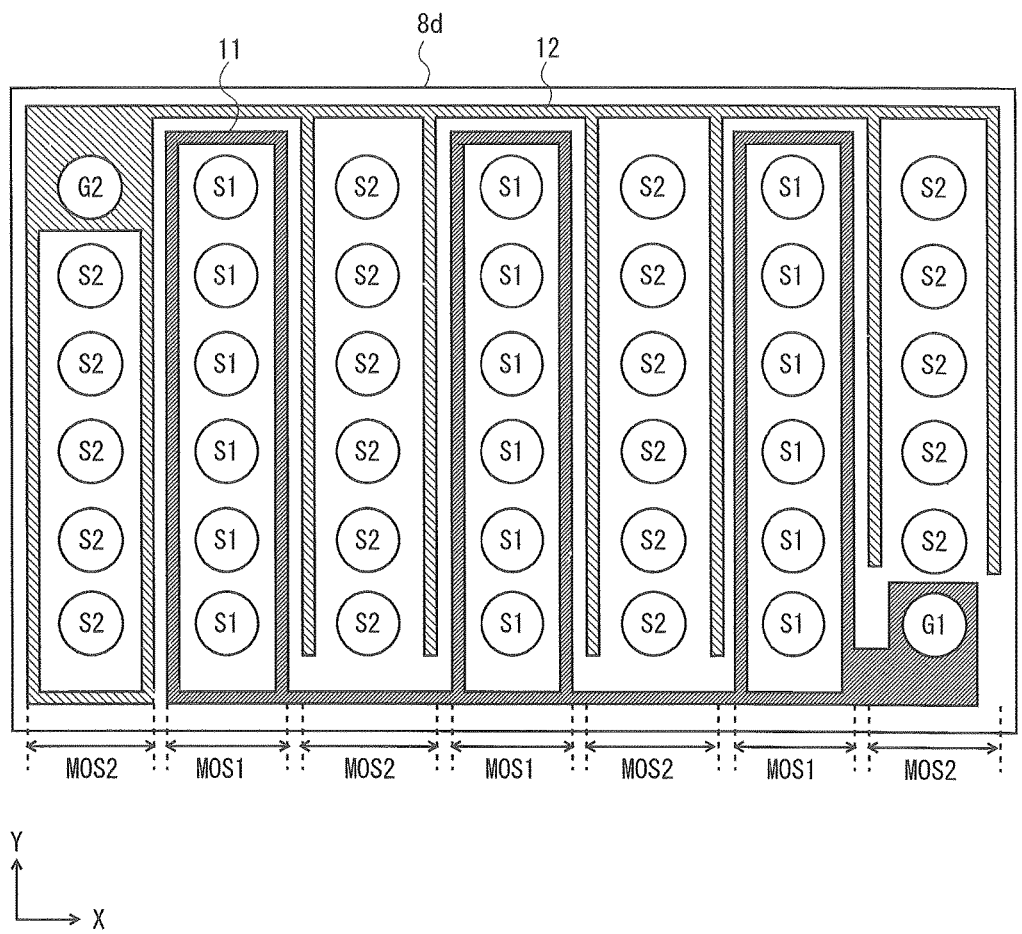
FIG. 33 is a schematic diagram of a fourth example of the layout of the semiconductor apparatus according to the sixth embodiment.

In the examples shown in FIGS. 32 and 33, the gate pads are disposed diagonally on the semiconductor chip.

Specifically, in the example shown in FIG. 32, the number of divided areas of the semiconductor apparatus 7a shown in FIG. 27 is seven. Further, in the example shown in FIG. 31, the number of divided areas of the semiconductor apparatus 7b shown in FIG. 28 is seven.

Next, FIGS. 34 to 39 are schematic diagrams of layouts of semiconductor apparatuses when the number of divisions of the first area is four and the number of divisions of the second area is five.

Figure 34:
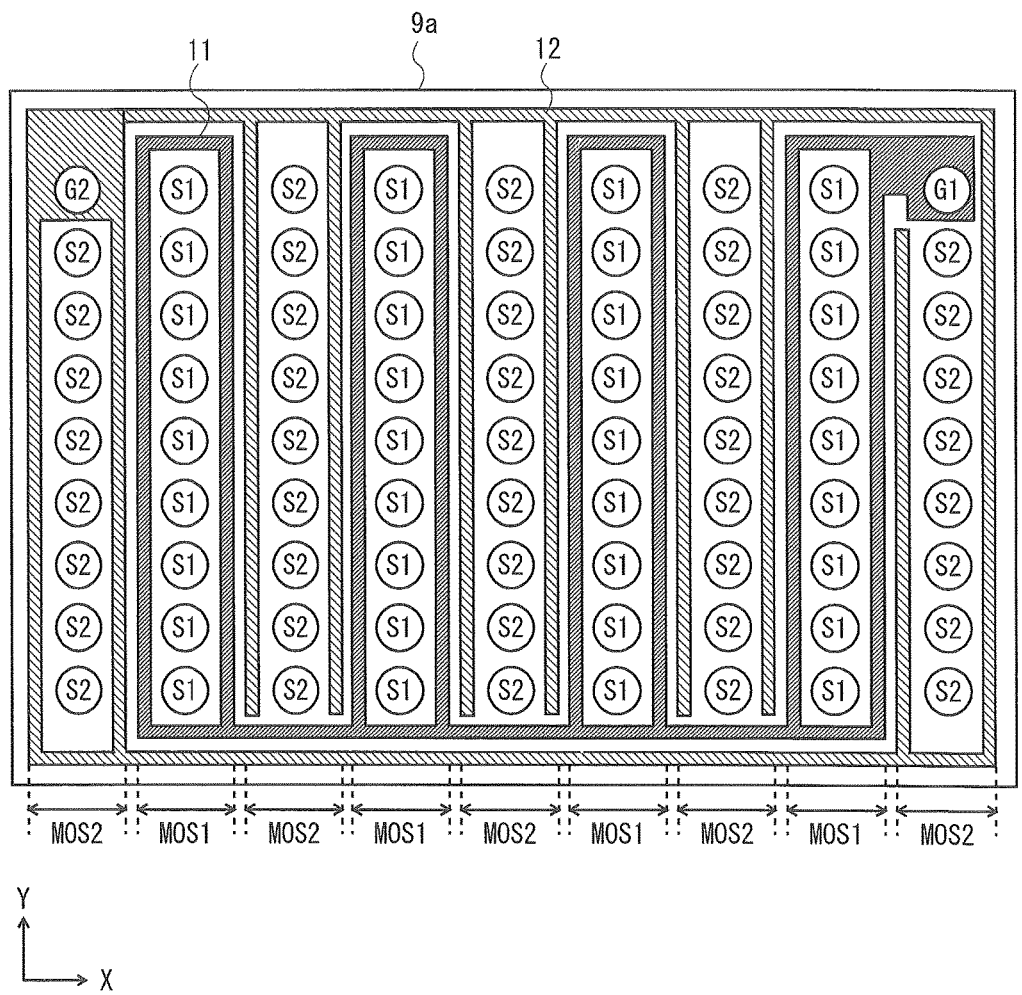
FIG. 34 is a schematic diagram of a fifth example of the layout of the semiconductor apparatus according to the sixth embodiment.
Figure 35:
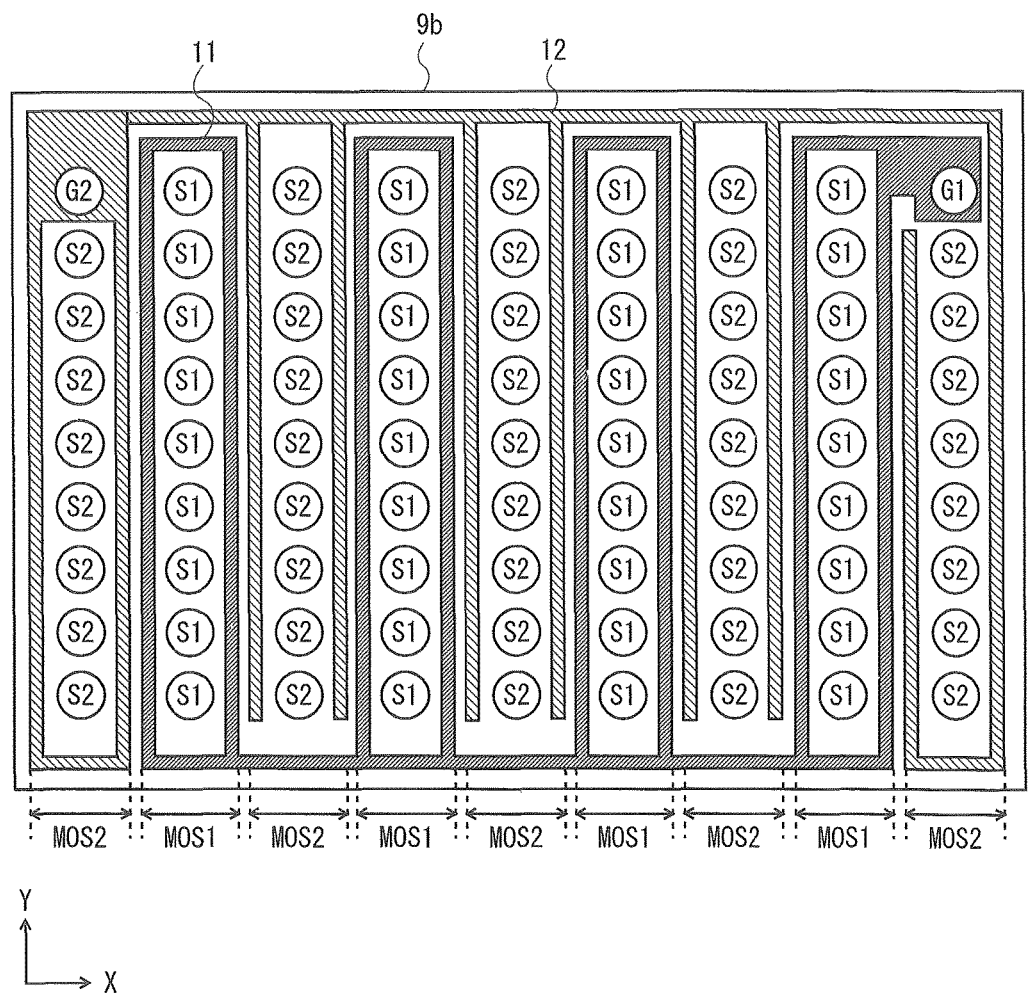
FIG. 35 is a schematic diagram of a sixth example of the layout of a semiconductor apparatus according to the sixth embodiment.

In the example shown in FIGS. 34 and 35, the gate pads are disposed in the upper part of the drawing. Specifically, in the example shown in FIG. 34, the number of divided areas of the semiconductor apparatus 6a shown in FIG. 24 is nine. Further, in the example shown in FIG. 35, the number of divided areas of the semiconductor apparatus 6b shown in FIG. 25 is nine.

Figure 36:
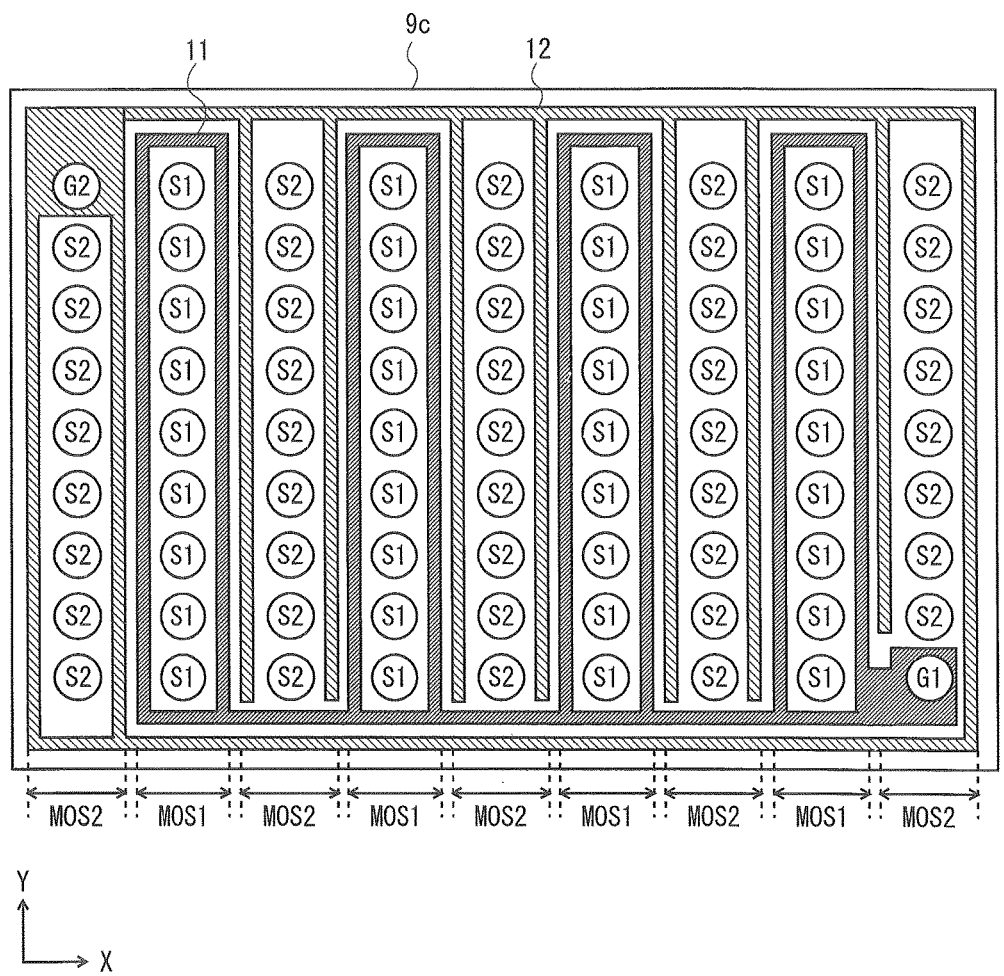
FIG. 36 is a schematic diagram of a seventh example of the layout of the semiconductor apparatus according to the sixth embodiment.
Figure 37:
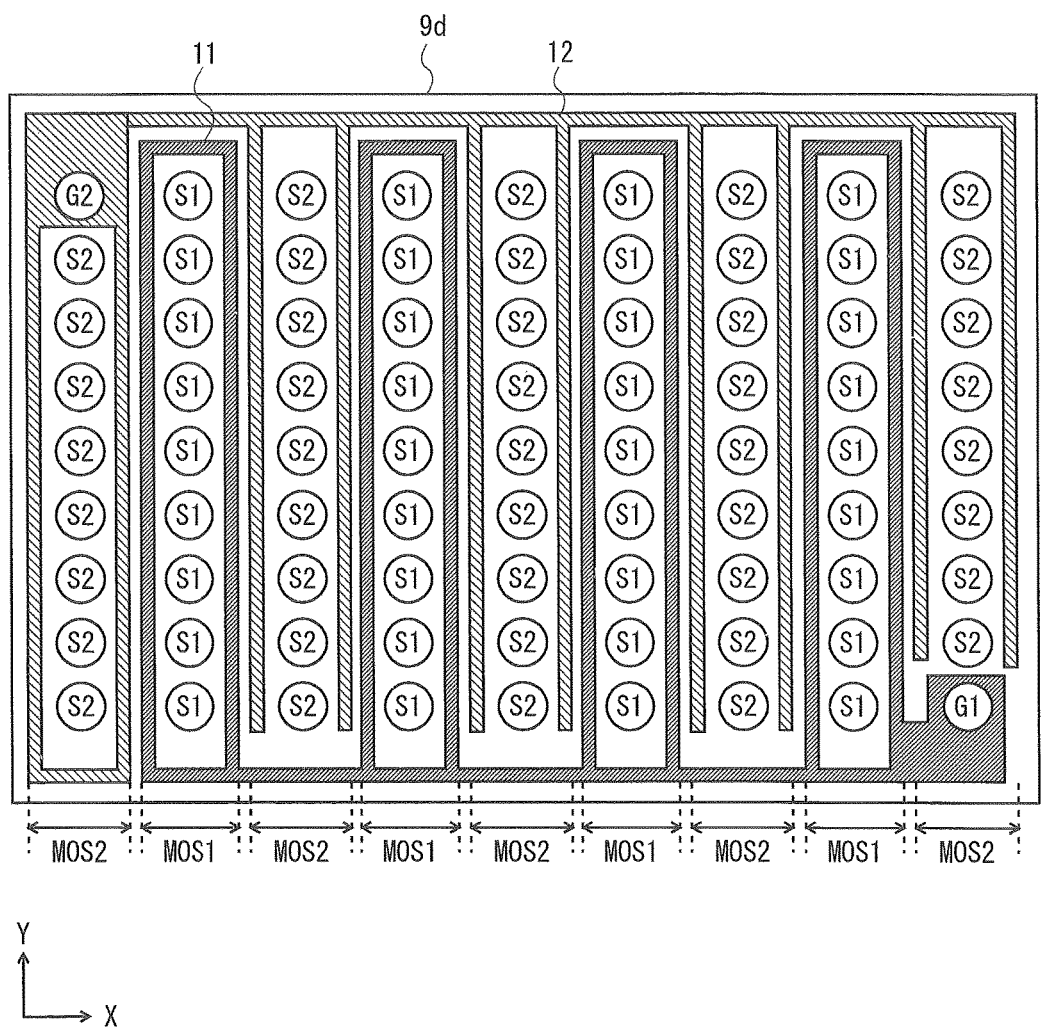
FIG. 37 is a schematic diagram of an eighth example of the layout of the semiconductor apparatus according to the sixth embodiment.

In the examples shown in FIGS. 36 and 37, the gate pads are disposed diagonally on the semiconductor chip.

Specifically, in the example shown in FIG. 36, the number of divided areas of the semiconductor apparatus 7a shown in FIG. 27 is nine. Further, in the example shown in FIG. 37, the number of divided areas of the semiconductor apparatus 7b shown in FIG. 28 is nine.

Figure 38:
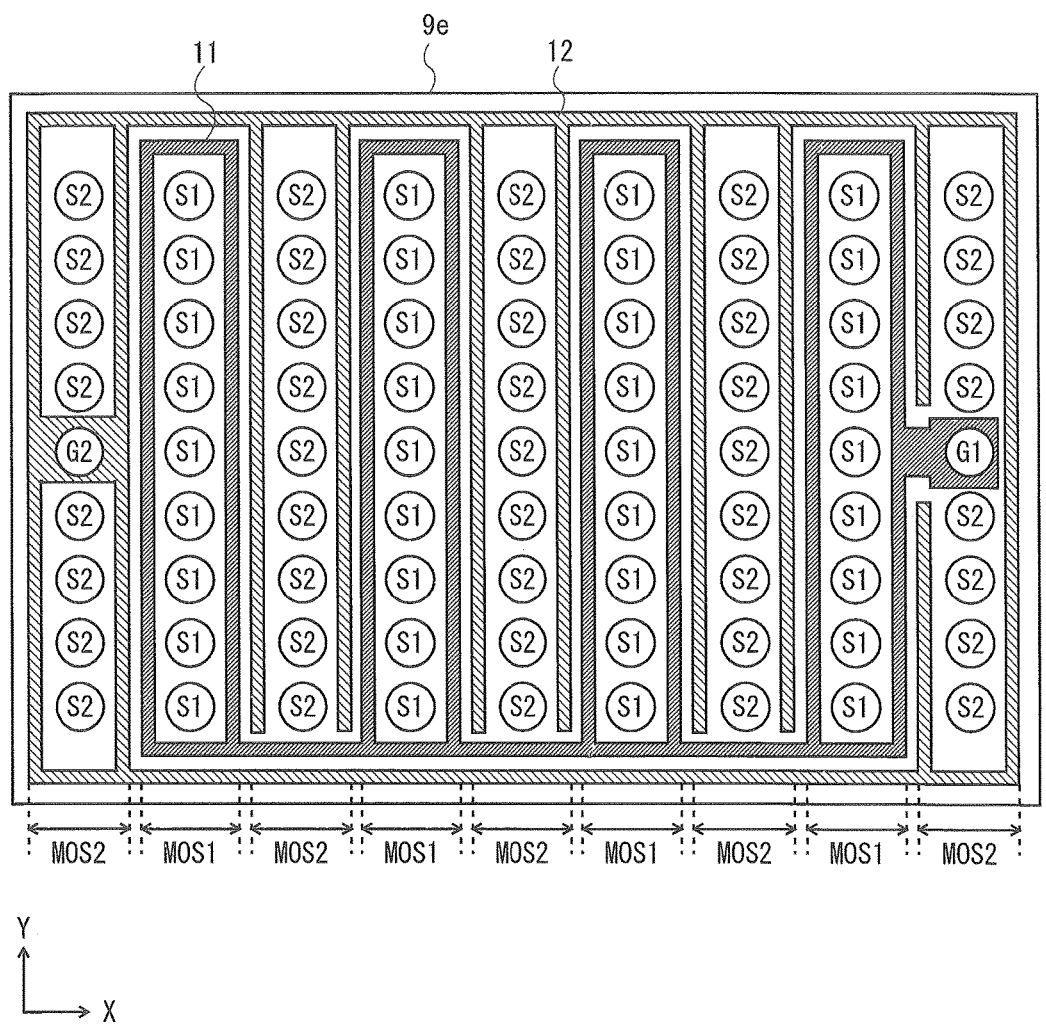
FIG. 38 is a schematic diagram of a ninth example of the layout of the semiconductor apparatus according to the sixth embodiment.
Figure 39:
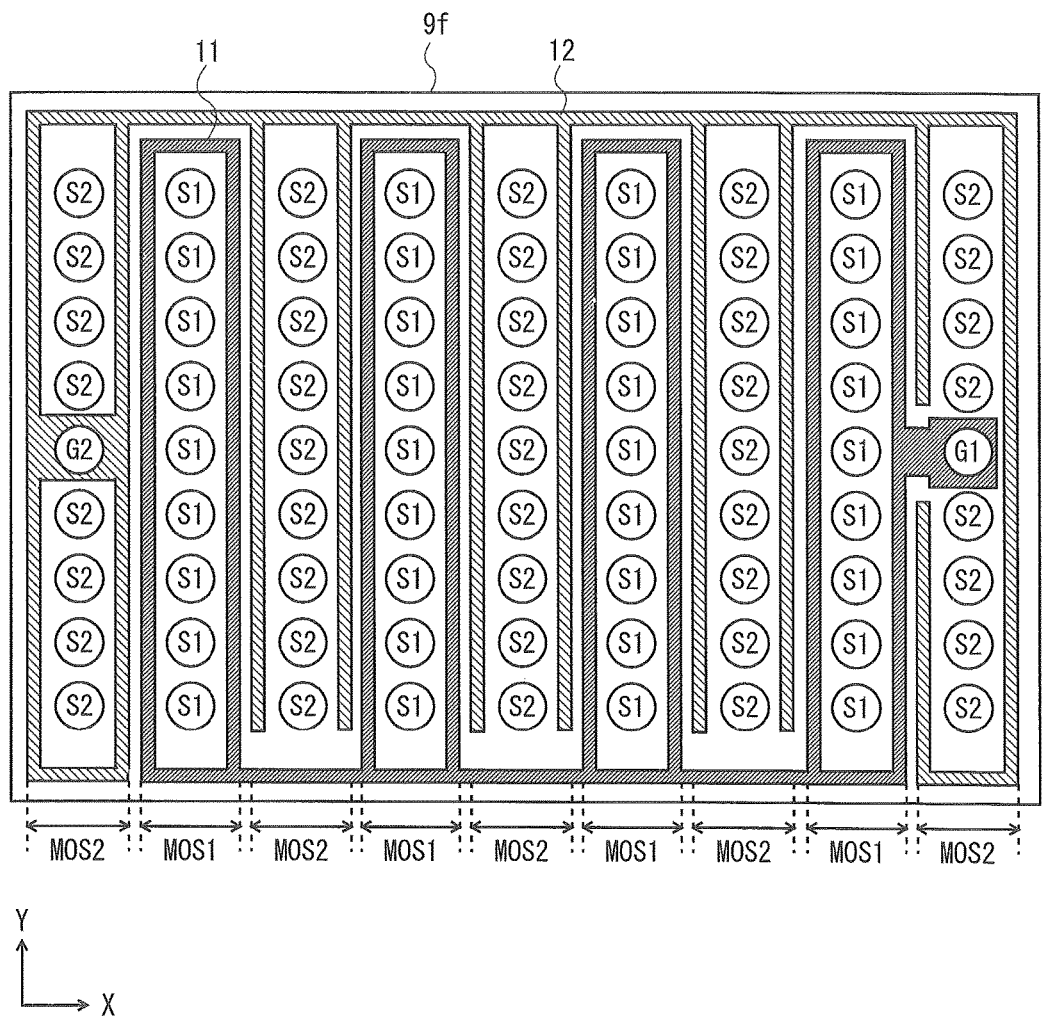
FIG. 39 is a schematic diagram of a tenth example of the layout of the semiconductor apparatus according to the sixth embodiment.

In the examples shown in FIGS. 38 and 39, the gate pads are disposed in the middle of the source pad sequences. Specifically, in the example shown in FIG. 38, the number of divided areas of the semiconductor apparatus 1 shown in FIG. 1 is nine. Further, in the example shown in FIG. 39, the portion of the gate line 12 of the semiconductor apparatus 9e shown in FIG. 28 that faces the gate line 11 is removed.

In the sixth embodiment, the modified example in which the number of divisions of the areas in the semiconductor apparatus 1 according to the first embodiment is increased has been explained. By increasing the number of divisions, the distance between the first transistor MOS1 and the second transistor MOS2 is reduced, and the number of parallel current paths is increased, thereby further reducing the inter-source electrode wiring of the semiconductor apparatus.

Although the invention carried out by the present inventor has been explained in detail based on the embodiments, it is obvious that the present invention is not limited to the above-described embodiments, and various modifications can be made within the range not departing from the scope of the invention. The whole or part of the embodiments disclosed above can be described as, but not limited to, the following supplementary notes.

(Supplementary Note 1)

A method of manufacturing a semiconductor apparatus comprising:

setting a first area on a semiconductor chip, the first area being divided into two or more areas, setting a second area on the semiconductor chip, a total area of the second area being larger than a total area of the first area, the second area being divided into two or more areas, and the divided areas of the first area and the second area are alternately arranged;

forming a first transistor in the first area;

forming a second transistor in the second area; and forming a gate pad of the first transistor and a gate pad of the second transistor in the second area.

(Supplementary Note 2)

The method according to Supplementary note 1, wherein a gate line of the first transistor is formed continuously across the divided first area that is connected to the gate pad of the first transistor, and a gate line of the second transistor is formed continuously across the divided second area that is connected to the gate pad of the second transistor.

(Supplementary Note 3)

The method according to Supplementary note 1, wherein the first transistor and the second transistors are trench transistors.

(Supplementary Note 4)
The method according to Supplementary note 1, wherein the number of divisions of the second area is greater than the number of divisions of the first area.

(Supplementary Note 5)
The method according to Supplementary note 1, wherein
a plurality of first source pads that are connected to a source of the first transistor are formed in the first area, and
a plurality of second source pads that are connected to a source of the second transistor, in which the number of the second source pads is greater than the number of the first source pads, are formed in the second area, (Supplementary Note 6)
The semiconductor apparatus according to Supplementary note 1, wherein
the gate pad of the first transistor and the gate pad of the second transistor are arranged along a contour of the semiconductor chip.

(Supplementary Note 7)
The semiconductor apparatus according to Supplementary note 1, wherein
a trench gate electrode that extends in a first direction and is connected to the gate pad is formed in the first area, and
a trench gate electrode that extends in a second direction orthogonal to the first direction and is connected to the gate pad is formed in the first area.

(Supplementary Note 8)
A method of manufacturing a semiconductor apparatus comprising:
setting a first area on a semiconductor chip, the first area being divided into two or more areas,
setting a second area on the semiconductor chip, the number of areas of the second area being greater than the number of areas of the first area, the second area being divided into two or more areas, and the divided areas of the first area and the second area are alternately arranged;
forming a first transistor in the first area;
forming a second transistor in the second area; and
forming a gate pad of the first transistor and a gate pad of the second transistor in the second area.

(Supplementary Note 9)
The method according to Supplementary note 8, wherein
a gate line of the first transistor is formed continuously across the divided first area that is connected to the gate pad of the first transistor, and
a gate line of the second transistor is formed continuously across the divided second area that is connected to the gate pad of the second transistor.

(Supplementary Note 10)
The method according to Supplementary note 1, wherein the first transistor and the second transistors are trench transistors.

(Supplementary Note 11)
The method according to Supplementary note 8, wherein a total area of the second area is larger than a total area of the first area.

(Supplementary Note 12)
The method according to Supplementary note 1, wherein
a plurality of first source pads that are connected to a source of the first transistor are formed in the first area, and
a plurality of second source pads that are connected to a source of the second transistor, in which the number of the second source pads is greater than the number of the first source pads, are formed in the second area, (Supplementary Note 13)
The semiconductor apparatus according to Supplementary note 8, wherein
the gate pad of the first transistor and the gate pad of the second transistor are arranged along a contour of the semiconductor chip.

(Supplementary Note 14)
The semiconductor apparatus according to Supplementary note 8, wherein
a trench gate electrode that extends in a first direction and is connected to the gate pad is formed in the first area, and
a trench gate electrode that extends in a second direction orthogonal to the first direction and is connected to the gate pad is formed in the first area.

The first to sixth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor apparatus comprising:
a first area, a first transistor being formed in two or more divided areas of the first area; and
a second area, a second transistor being formed in two or more divided areas of the second area, wherein
the number of areas of the second area is greater than the number of areas of the first area,
the divided areas of the first area and the second area are alternately arranged, and
a first source pad connected to a source of the first transistor is formed in the first area, and a second source pad connected to a source of the second transistor is formed in the second area.

2. The semiconductor apparatus according to claim 1, wherein
a gate pad of the first transistor and a gate pad of the second transistor are formed in the second area,
a gate line of the first transistor is formed continuously across the divided first area that is connected to the gate pad of the first transistor, and
a gate line of the second transistor is formed continuously across the second area that is connected to the gate pad of the second transistor.

3. The semiconductor apparatus according to claim 1, wherein
the first transistor and the second transistor are trench transistors, and
a current flowing from the source of the first transistor is output from the source of the second transistor via a substrate area of the semiconductor apparatus.

4. The semiconductor apparatus according to claim 1, wherein
a total area of the second area is larger than a total area of the first area, and
the total number of the number of divisions of the first area and the number of divisions of the second area is five or greater.

5. The semiconductor apparatus according to claim 1, wherein
a total area of the second source pad is larger than a total area of the first source pad; or
the first source pad comprises a plurality of first source pads and the second source pad comprises a plurality of second source pads, and the number of the second source pads is greater than the number of the first source pads.

6. The semiconductor apparatus according to claim 5, wherein
the first source pad and the second source pad have continuous shapes in each of the divided areas.

7. The semiconductor apparatus according to claim 1, wherein
a gate pad of the first transistor and a gate pad of the second transistor are formed in the second area, and
the gate pad of the first transistor and the gate pad of the second transistor are arranged along a contour of the semiconductor chip on which the first transistor and the second transistor are formed.

8. The semiconductor apparatus according to claim 7, wherein
the second source pad comprises a plurality of second source pads, and the second area includes a plurality of source pad sequences in which the second source pads are continuously arranged, and
the gate pad of the first transistor and the gate pad of the second transistor are disposed in the same source pad sequence among the plurality of source pad sequences.

9. The semiconductor apparatus according to claim 7, wherein
the gate pad of the first transistor and the gate pad of the second transistor are arranged diagonally on the semiconductor chip.

10. The semiconductor apparatus according to claim 7, wherein
the second source pad comprises a plurality of second source pads, and the second area includes a plurality of source pad sequences in which the second source pads are consecutively arranged, and
the gate pad of the first transistor and the gate pad of the second transistor are disposed in different source pad sequences from each other among the plurality of source pad sequences.

11. The semiconductor apparatus according to claim 1, wherein
a gate pad of the first transistor and a gate pad of the second transistor are formed in the second area,
trench gate electrodes that are connected to the respective gate pads are formed in the first area and the second area, and
the trench gate electrode formed in the first area and the trench gate electrode formed in the second area are formed to extend in directions that are orthogonal to each other.

12. The semiconductor apparatus according to claim 1, wherein a gate pad of the first transistor and a gate pad of the second transistor are formed in the second area, and
wherein the semiconductor apparatus further comprises:
a gate line of the first transistor, the gate line comprising a polygonal shape where the gate pad is formed.

13. The semiconductor apparatus according to claim 1, wherein a gate pad of the first transistor and a gate pad of the second transistor are formed in the second area, and
wherein the semiconductor apparatus further comprises:
a back-metal layer on a second plane, the second plane being opposed to a first plane where the gate pad is provided among planes of the semiconductor chip on which the first transistor and the second transistor are formed.

14. The semiconductor apparatus according to claim 1, further comprising:
a semiconductor substrate of a first conductivity-type;
a metal layer formed on a back surface of the semiconductor substrate;
an epitaxial layer formed on a front surface of the semiconductor substrate;
a second conductivity-type diffusion layer formed on the epitaxial layer; and
a first conductivity-type diffusion layer formed on the second conductivity-type diffusion layer,
wherein the first and second transistors comprise vertical transistors which are formed in a trench formed in the first conductivity-type diffusion layer, the second conductivity-type diffusion layer and the epitaxial layer.

15. The semiconductor apparatus according to claim 1, wherein a gate pad of the first transistor and a gate pad of the second transistor are formed in the second area, and
wherein the first source pad comprises a plurality of first source pads, and the semiconductor apparatus further comprises:
a first gate line of the first transistor, which is formed in the first area and surrounds the plurality of first source pads, and comprises:
a pair of long sections;
a pair of short sections which connect the ends of the pair of long sections; and
an extended portion which extends from a long section of the plurality of long sections, into the second area and connects to the gate pad of the first transistor.

16. A semiconductor apparatus comprising:
a first area, a first transistor being formed in two or more divided areas of the first area; and
a second area, a second transistor being formed in two or more divided areas of the second area,
wherein the number of areas of the second area is greater than the number of areas of the first area,
wherein the divided areas of the first area and the second area are alternately arranged, and
wherein each of the first and second transistors comprise a trench transistor, and a current flowing from a source of the first transistor is output from a source of the second transistor via a substrate area of the semiconductor apparatus.

17. A semiconductor apparatus comprising:
a first area, a first transistor being formed in two or more divided areas of the first area; and
a second area, a second transistor being formed in two or more divided areas of the second area,
wherein the number of areas of the second area is greater than the number of areas of the first area,
wherein the divided areas of the first area and the second area are alternately arranged, and
wherein a total area of the second area is larger than a total area of the first area, and the total number of the number of divisions of the first area and the number of divisions of the second area is five or greater.

* * * * *